(12) United States Patent
Hashizume

(10) Patent No.: US 8,883,653 B2
(45) Date of Patent: Nov. 11, 2014

(54) SUBSTRATE TREATMENT METHOD AND SUBSTRATE TREATMENT APPARATUS

(75) Inventor: Akio Hashizume, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 122 days.

(21) Appl. No.: 13/353,962

(22) Filed: Jan. 19, 2012

(65) Prior Publication Data

US 2012/0187083 A1     Jul. 26, 2012

(30) Foreign Application Priority Data

Jan. 20, 2011 (JP) ................. 2011-010154
Mar. 23, 2011 (JP) ................. 2011-063722

(51) Int. Cl.
| | |
|---|---|
| H01L 21/302 | (2006.01) |
| H01L 21/461 | (2006.01) |
| H01L 21/311 | (2006.01) |
| H01L 21/3105 | (2006.01) |
| H01L 21/67 | (2006.01) |
| H01L 21/687 | (2006.01) |
| H01L 21/02 | (2006.01) |

(52) U.S. Cl.
CPC ...... *H01L 21/3105* (2013.01); *H01L 21/31116* (2013.01); *H01L 21/67126* (2013.01); *H01L 21/0217* (2013.01); *H01L 21/6719* (2013.01); *H01L 21/67115* (2013.01); *H01L 21/67028* (2013.01); *H01L 21/68742* (2013.01); *H01L 21/67207* (2013.01); *H01L 21/02164* (2013.01); *H01L 21/31111* (2013.01)
USPC ................. 438/745; 438/756; 438/757

(58) Field of Classification Search
CPC ................. H01L 21/31111; H01L 21/6708; H01L 21/02164; H01L 21/02359; H01L 21/3105
See application file for complete search history.

(56) References Cited

U.S. PATENT DOCUMENTS

| | | | | |
|---|---|---|---|---|
| 4,349,609 | A * | 9/1982 | Takeda et al. ................. | 428/429 |
| 4,803,181 | A * | 2/1989 | Buchmann et al. ........... | 438/696 |
| 4,871,418 | A * | 10/1989 | Wittlinger et al. ............ | 438/106 |
| 6,673,525 | B1 * | 1/2004 | Wheeler ....................... | 430/326 |
| 7,687,917 | B2 | 3/2010 | Ohto et al. .................... | 257/774 |
| 7,737,555 | B2 | 6/2010 | Ohto et al. .................... | 257/751 |
| 7,842,602 | B2 | 11/2010 | Ohto et al. .................... | 438/622 |
| 8,115,318 | B2 | 2/2012 | Ohto et al. .................... | 257/774 |
| 8,642,467 | B2 | 2/2014 | Ohto et al. .................... | 438/627 |
| 2003/0209738 | A1 | 11/2003 | Ohto et al. .................... | 257/257 |
| 2007/0077768 | A1 | 4/2007 | Fujii et al. ..................... | 438/717 |

(Continued)

FOREIGN PATENT DOCUMENTS

| | | |
|---|---|---|
| CN | 1953145 A | 4/2007 |
| CN | 101499418 A | 8/2009 |
| JP | 2002-75954 | 3/2002 |
| JP | 2006-86411 | 3/2006 |

(Continued)

*Primary Examiner* — Duy Deo
(74) *Attorney, Agent, or Firm* — Ostrolenk Faber LLP

(57) ABSTRACT

An inventive substrate treatment method includes a silylation step of supplying a silylation agent to a substrate, and an etching step of supplying an etching agent to the substrate after the silylation step. The method may further include a repeating step of repeating a sequence cycle including the silylation step and the etching step a plurality of times. The cycle may further include a rinsing step of supplying a rinse liquid to the substrate after the etching step. The cycle may further include a UV irradiation step of irradiating the substrate with ultraviolet radiation after the etching step. The method may further include a pre-silylation or post-silylation UV irradiation step of irradiating the substrate with the ultraviolet radiation before or after the silylation step.

13 Claims, 24 Drawing Sheets

(56) References Cited

U.S. PATENT DOCUMENTS

| | | |
|---|---|---|
| 2007/0082491 A1 | 4/2007 | Uozumi et al. ............... 438/692 |
| 2008/0057728 A1 | 3/2008 | Shimura et al. |
| 2008/0268655 A1 | 10/2008 | Gale et al. .................... 438/779 |
| 2009/0194234 A1 | 8/2009 | Arai et al. ................ 156/345.23 |
| 2010/0099256 A1* | 4/2010 | Asako et al. ................. 438/675 |
| 2011/0195190 A1 | 8/2011 | Koshiyama et al. |
| 2012/0264308 A1* | 10/2012 | Watanabe et al. ............. 438/757 |

FOREIGN PATENT DOCUMENTS

| | | |
|---|---|---|
| JP | 2007-258405 | 10/2007 |
| JP | 2009-188411 | 8/2009 |
| JP | 2010-103151 | 5/2010 |
| JP | 2010-287655 | 12/2010 |
| TW | 559999 B | 11/2003 |
| TW | 200621391 A | 7/2006 |
| TW | 200629404 A | 8/2006 |
| TW | 200721311 A | 6/2007 |

* cited by examiner

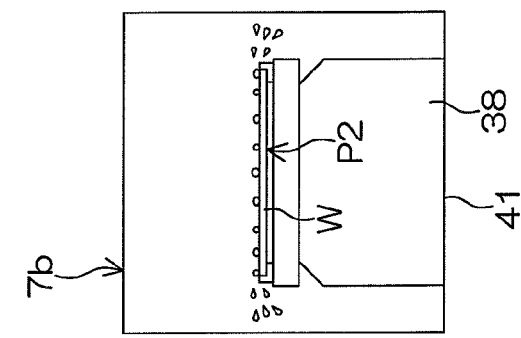
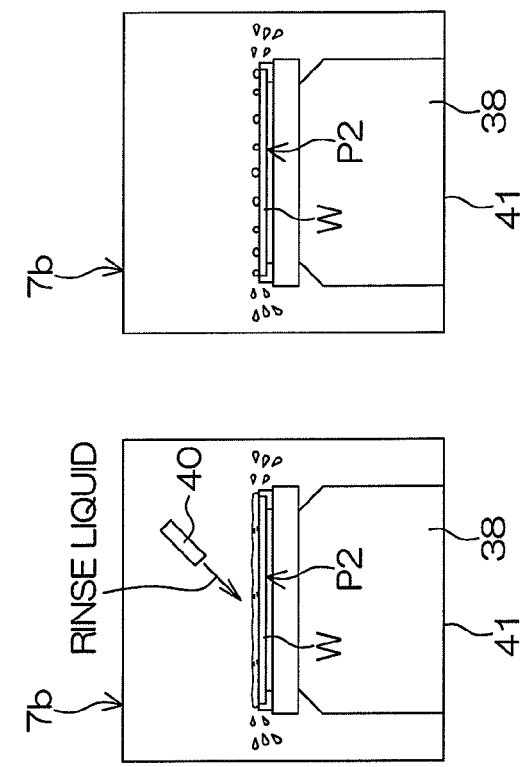
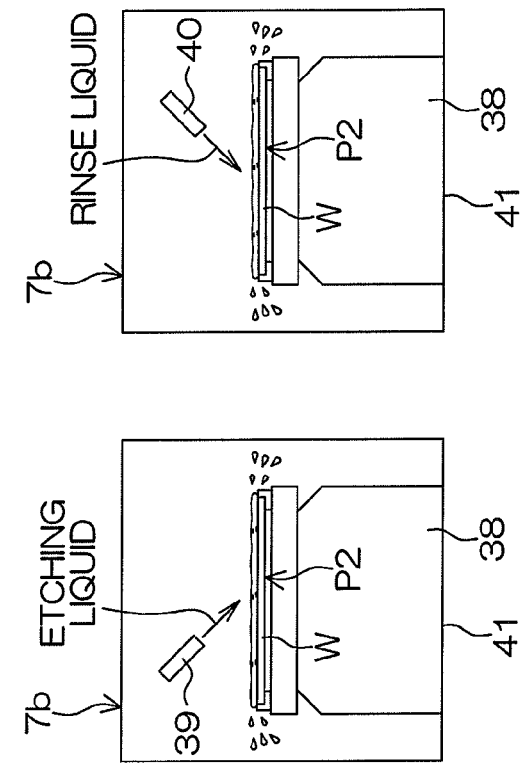
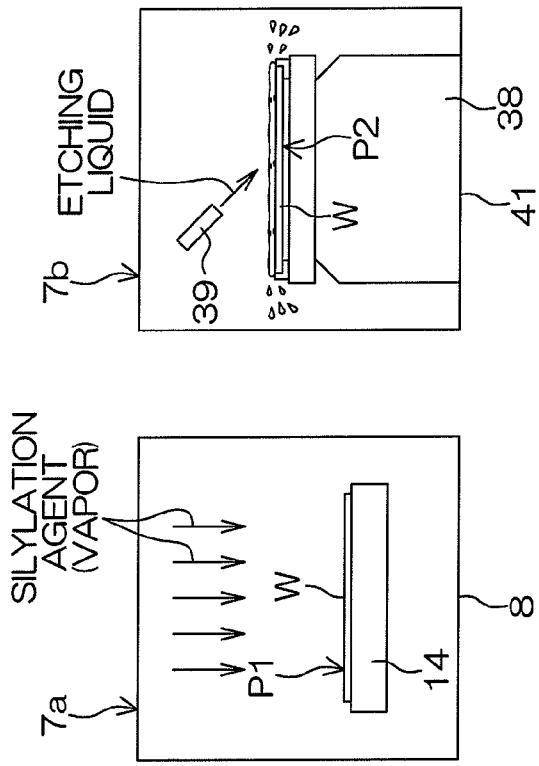

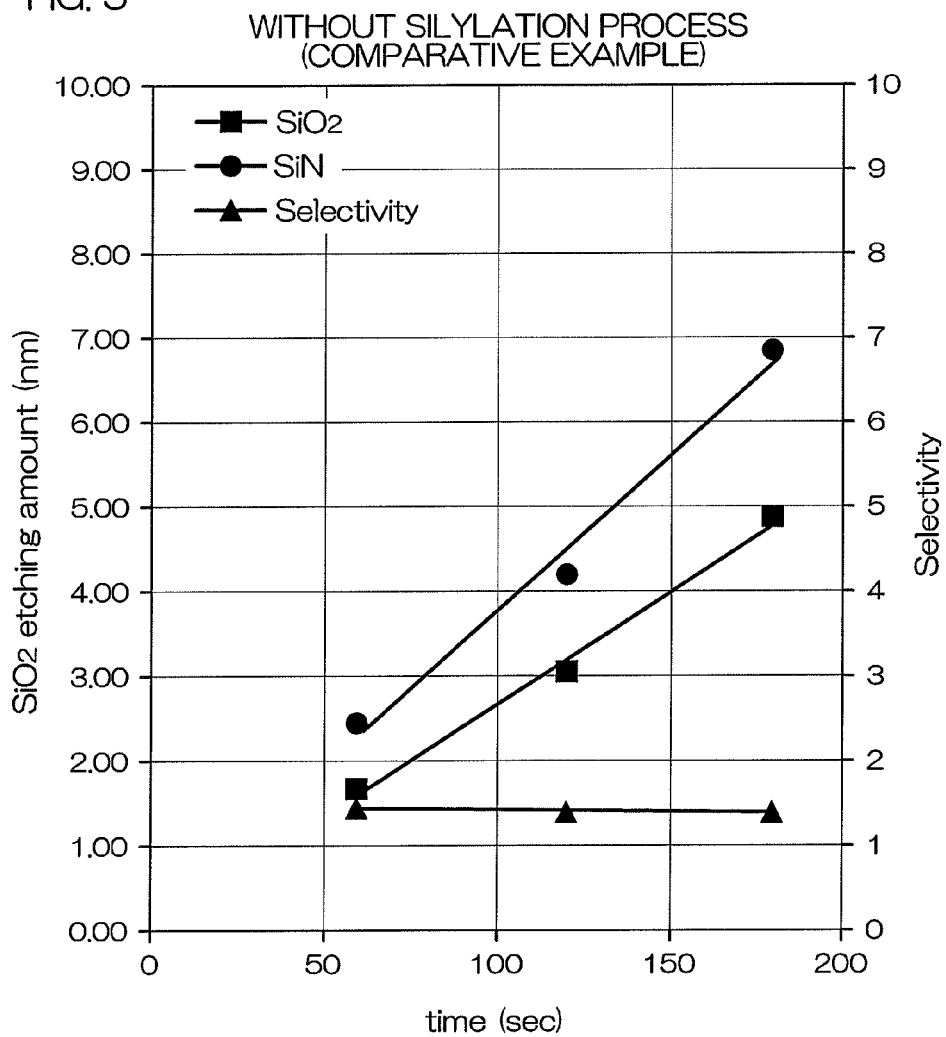

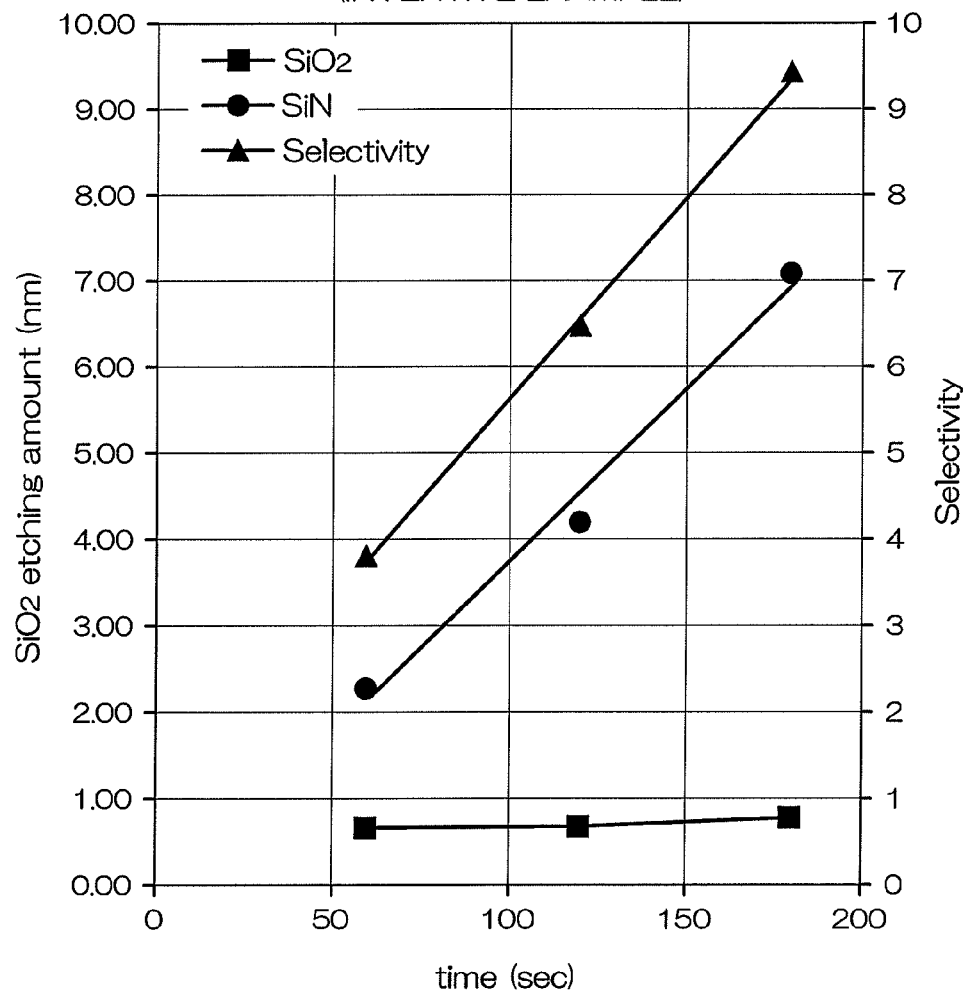

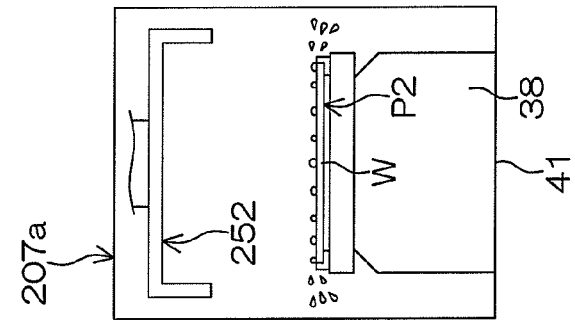
FIG. 10 (a) SILYLATION PROCESS
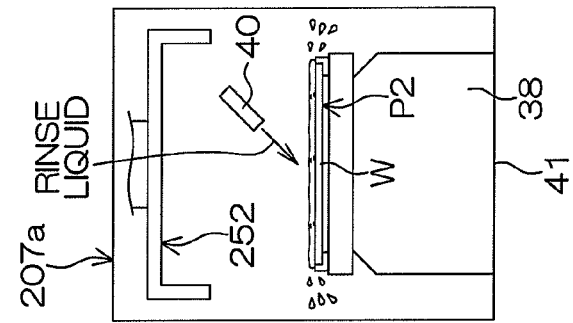
FIG. 10 (b) ETCHING PROCESS
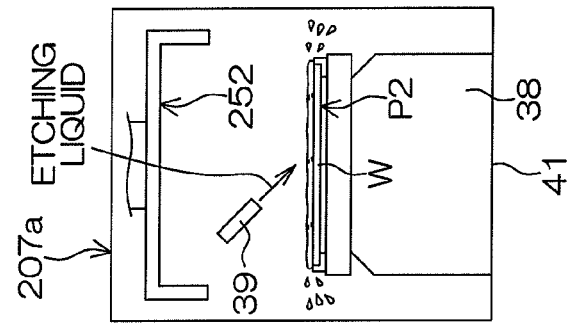
FIG. 10 (c) RINSING PROCESS
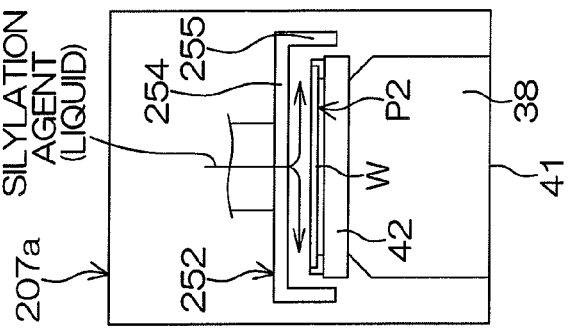
FIG. 10 (d) DRYING PROCESS

FIG. 16

| EXEMPLARY PROCESS 4-1 | SILYLATION PROCESS → ETCHING PROCESS |
| --- | --- |
| EXEMPLARY PROCESS 4-2 | SILYLATION PROCESS → ETCHING PROCESS → RINSING PROCESS |
| EXEMPLARY PROCESS 4-3 | [SILYLATION PROCESS → ETCHING PROCESS] → RINSING PROCESS |
| EXEMPLARY PROCESS 4-4 | [SILYLATION PROCESS → ETCHING PROCESS → RINSING PROCESS] |

Processes enclosed in square brackets are repeated twice or more.

FIG. 21

| EXEMPLARY PROCESS 5-1 | SILYLATION PROCESS → COOLING PROCESS → ETCHING PROCESS |
|---|---|
| EXEMPLARY PROCESS 5-2 | SILYLATION PROCESS → COOLING PROCESS → ETCHING PROCESS → RINSING PROCESS |
| EXEMPLARY PROCESS 5-3 | [SILYLATION PROCESS → COOLING PROCESS → ETCHING PROCESS] → RINSING PROCESS |
| EXEMPLARY PROCESS 5-4 | [SILYLATION PROCESS → COOLING PROCESS → ETCHING PROCESS → RINSING PROCESS] |

Processes enclosed in square brackets are repeated twice or more.

FIG. 25

| | |
|---|---|
| EXEMPLARY PROCESS 6-1 | UV PROCESS → SILYLATION PROCESS → ETCHING PROCESS |
| EXEMPLARY PROCESS 6-2 | UV PROCESS → SILYLATION PROCESS → ETCHING PROCESS → UV PROCESS |
| EXEMPLARY PROCESS 6-3 | UV PROCESS → SILYLATION PROCESS → ETCHING PROCESS → RINSING PROCESS |
| EXEMPLARY PROCESS 6-4 | UV PROCESS → SILYLATION PROCESS → ETCHING PROCESS → UV PROCESS → RINSING PROCESS |
| EXEMPLARY PROCESS 6-5 | UV PROCESS → [SILYLATION PROCESS → ETCHING PROCESS] → RINSING PROCESS |
| EXEMPLARY PROCESS 6-6 | UV PROCESS → [SILYLATION PROCESS → ETCHING PROCESS] → UV PROCESS |
| EXEMPLARY PROCESS 6-7 | UV PROCESS → [SILYLATION PROCESS → ETCHING PROCESS] → RINSING PROCESS |
| EXEMPLARY PROCESS 6-8 | UV PROCESS → [SILYLATION PROCESS → ETCHING PROCESS] → UV PROCESS → RINSING PROCESS |

Processes enclosed in square brackets are repeated twice or more.

SUBSTRATE TREATMENT METHOD AND SUBSTRATE TREATMENT APPARATUS

BACKGROUND OF THE INVENTION

1. Field of the Invention

The present invention relates to a substrate treatment method and a substrate treatment apparatus for treating a substrate. Examples of the substrate to be treated include semiconductor wafers, substrates for liquid crystal display devices, substrates for plasma display devices, substrates for FED (Field Emission Display) devices, substrates for optical disks, substrates for magnetic disks, substrates for magneto-optical disks, substrates for photo masks, ceramic substrates, and substrates for solar cells.

2. Description of Related Art

In production processes for semiconductor devices and liquid crystal display devices, a substrate having a silicon nitride film (SiN film) and a silicon oxide film ($SiO_2$ film) formed on a front surface thereof often requires selective etching for selectively removing the silicon nitride film from the front surface. In this case, a phosphoric acid aqueous solution heated to a higher temperature (e.g., 120° C. to 160° C.) is supplied as an etching liquid to the front surface of the substrate (see, for example, JP-A-2007-258405).

SUMMARY OF THE INVENTION

The present invention provides a substrate treatment method and a substrate treatment apparatus which ensure that a substrate treatment can be performed for selective etching at a higher selectivity (nitride removal amount/oxide removal amount).

The inventive substrate treatment method includes a silylation step of supplying a silylation agent to a substrate, and an etching step of supplying an etching agent to the substrate after the silylation step.

According to this method, the substrate is silylated by the supply of the silylation agent before the substrate is etched by the supply of the etching agent. Therefore, the silylated substrate is etched. As will be described later, where a substrate formed with an oxide film and a nitride film is silylated, etching of the oxide film is suppressed. Therefore, the etching of the silylated substrate improves the selectivity (nitride removal amount/oxide removal amount).

The substrate treatment method may further include a rinsing step of supplying a rinse liquid to the substrate after the etching step, and a drying step of drying the substrate after the rinsing step.

The substrate treatment method may further include a heating step of heating the substrate, the heating step being performed simultaneously with the silylation step. In this case, the temperature of the substrate is increased, so that reduction in the temperature of the silylation agent supplied to the substrate is suppressed. Therefore, even if the activity of the silylation agent varies with the temperature, the activity of the silylation agent can be stabilized. If the temperature of the substrate is higher than the temperature of the silylation agent supplied to the substrate, the temperature of the silylation gent supplied to the substrate can be increased. Therefore, where the activity of the silylation agent is increased with the temperature, the silylation agent can have a higher activity.

According to an embodiment of the present invention, the substrate treatment method includes a repeating step of repeating a sequence cycle including the silylation step and the etching step a plurality of times. According to this method, the silylated substrate is etched. Thereafter, the etched substrate is silylated again. Then, the silylated substrate is etched again. That is, the etching of the substrate is interrupted, and the substrate is silylated again during an etching interruption period. If the supply of the etching agent is continued for a longer period of time, an oxide etching suppression effect of the silylation agent is reduced during the etching, thereby reducing the selectivity. Therefore, the oxide etching suppression effect can be recovered by the re-silylation of the substrate. This suppresses the etching of the oxide film when the etching is resumed, thereby substantially preventing the reduction in selectivity.

The cycle preferably further includes a rinsing step of supplying the rinse liquid to the substrate after the etching step. In this case, the silylated substrate is etched, and then the rinse liquid is supplied to the etched substrate to rinse away liquid and foreign matter adhering to the substrate. Then, the silylation step, the etching step and the rinsing step are successively performed again. Foreign matter resulting from the etching is liable to adhere to the etched substrate. Particularly, when the etching agent to be supplied to the substrate is in a vapor form, the foreign matter is more liable to remain on the substrate than when the etching agent is in a liquid form. If the foreign matter resulting from the etching remains on the substrate during the silylation of the substrate, it is often difficult to remove the foreign matter from the substrate. Therefore, the foreign matter adhering to the substrate is removed before the re-silylation, whereby persistent adhesion of the foreign matter to the substrate can be substantially prevented. This substantially prevents the foreign matter from remaining on the substrate, thereby improving the cleanliness of the substrate.

The cycle preferably further includes a UV irradiation step of irradiating the substrate with ultraviolet radiation after the etching step. In this case, the sequence cycle including the silylation step, the etching step and the UV irradiation step is repeated a plurality of times. In each cycle, the substrate to which the silylation agent and then the etching agent have been supplied is irradiated with the ultraviolet radiation. In the second and subsequent cycles, the silylation agent and then the etching agent are supplied to the substrate which has been irradiated with the ultraviolet radiation. The silylation agent adhering to the substrate can be removed by the irradiation of the silylated substrate with the ultraviolet radiation. This improves the cleanliness of the substrate. In the second and subsequent cycles, the silylation agent and then the etching agent are supplied to the substrate from which organic substances and other foreign matter have been removed by the irradiation with the ultraviolet radiation. Therefore, the reactivity of the silylation agent and the etching agent with the substrate is improved in the second and subsequent cycles. This improves the selectivity.

According to another embodiment of the present invention, the method further includes a pre-silylation UV irradiation step of irradiating the substrate with the ultraviolet radiation before the silylation step. According to this method, the silylation agent and then the etching agent are supplied to the substrate after the substrate is irradiated with the ultraviolet radiation. Organic substances and other foreign matter adhering to the substrate can be removed by the irradiation of the substrate with the ultraviolet radiation. This improves the reactivity of the silylation agent and the etching agent with the substrate, thereby improving the selectivity.

According to further another embodiment of the present invention, the method further includes a post-silylation UV irradiation step of irradiating the substrate with the ultraviolet radiation after the silylation step. According to this method, the silylated substrate is irradiated with the ultraviolet radiation. The silylation agent adhering to the substrate can be removed by the irradiation of the silylated substrate with the ultraviolet radiation. This improves the cleanliness of the substrate.

The etching agent to be supplied to the substrate in the etching step may be a liquid mixture containing hydrofluoric acid and ethylene glycol.

According to still another embodiment of the present invention, the silylation agent is nonaqueous, and the etching agent is aqueous. The nonaqueous silylation agent may be a silylation agent which is completely insoluble in water or substantially insoluble in water. In this embodiment, the aqueous etching agent is supplied to the substrate after the nonaqueous silylation agent is supplied to the substrate. Since the silylation agent is nonaqueous, the silylation agent adhering to the substrate is insoluble in the etching agent supplied to the substrate. Therefore, the etching of the oxide film can be continuously suppressed. This substantially prevents the reduction in selectivity.

The etching agent to be supplied to the substrate in the etching step may be a vapor containing an etching component.

The inventive substrate treatment apparatus includes: a substrate holding unit which holds a substrate at a silylation position and at an etching position; a silylation agent supply unit which supplies a silylation agent to the substrate held at the silylation position by the substrate holding unit; an etching agent supply unit which supplies an etching agent to the substrate held at the etching position by the substrate holding unit; and a control unit which controls the silylation agent supply unit and the etching agent supply unit. The control unit controls the silylation agent supply unit to perform a silylation step of supplying the silylation agent to the substrate held at the silylation position by the substrate holding unit. Further, the control unit controls the etching agent supply unit to perform an etching step of supplying the etching agent to the substrate held at the etching position by the substrate holding unit after the silylation step.

The silylation position and the etching position may be located at the same position. That is, the substrate may be located at the same position during the supply of the silylation agent to the substrate and during the supply of the etching agent to the substrate. In this case, there is no need to move the substrate to the etching position after the supply of the silylation agent to the substrate. This reduces a substrate transport period, thereby reducing a substrate treatment period.

The substrate treatment apparatus may further include a UV irradiation unit which irradiates the substrate with ultraviolet radiation.

Other elements, features, steps, characteristics and advantages of the present invention will become more apparent from the following detailed description of the preferred embodiments with reference to the attached drawings.

BRIEF DESCRIPTION OF THE DRAWINGS

FIGS. 4(a) to 4(d) are diagrams for explaining an exemplary substrate treatment to be performed by the substrate treatment apparatus according to the first embodiment of the present invention.

FIG. 5 is a graph showing a relationship between an etching period, an etching amount and a selectivity observed when a substrate not subjected to silylation was etched.

FIG. 6 is a graph showing a relationship between the etching period, the etching amount and the selectivity observed when a substrate subjected to the silylation was etched.

FIGS. 10(a) to 10(d) are diagrams for explaining an exemplary substrate treatment to be performed by the substrate treatment apparatus according to the second embodiment of the present invention.

FIG. 16 is a diagram for explaining exemplary substrate treatments to be performed by the substrate treatment apparatus according to the fourth embodiment of the present invention.

FIG. 21 is a diagram for explaining exemplary substrate treatments to be performed by the substrate treatment apparatus according to the fifth embodiment of the present invention.

FIG. 25 is a diagram for explaining exemplary substrate treatments to be performed by the substrate treatment apparatus according to the sixth embodiment of the present invention.

DETAILED DESCRIPTION OF THE PREFERRED EMBODIMENTS

First Embodiment

Figure 1:
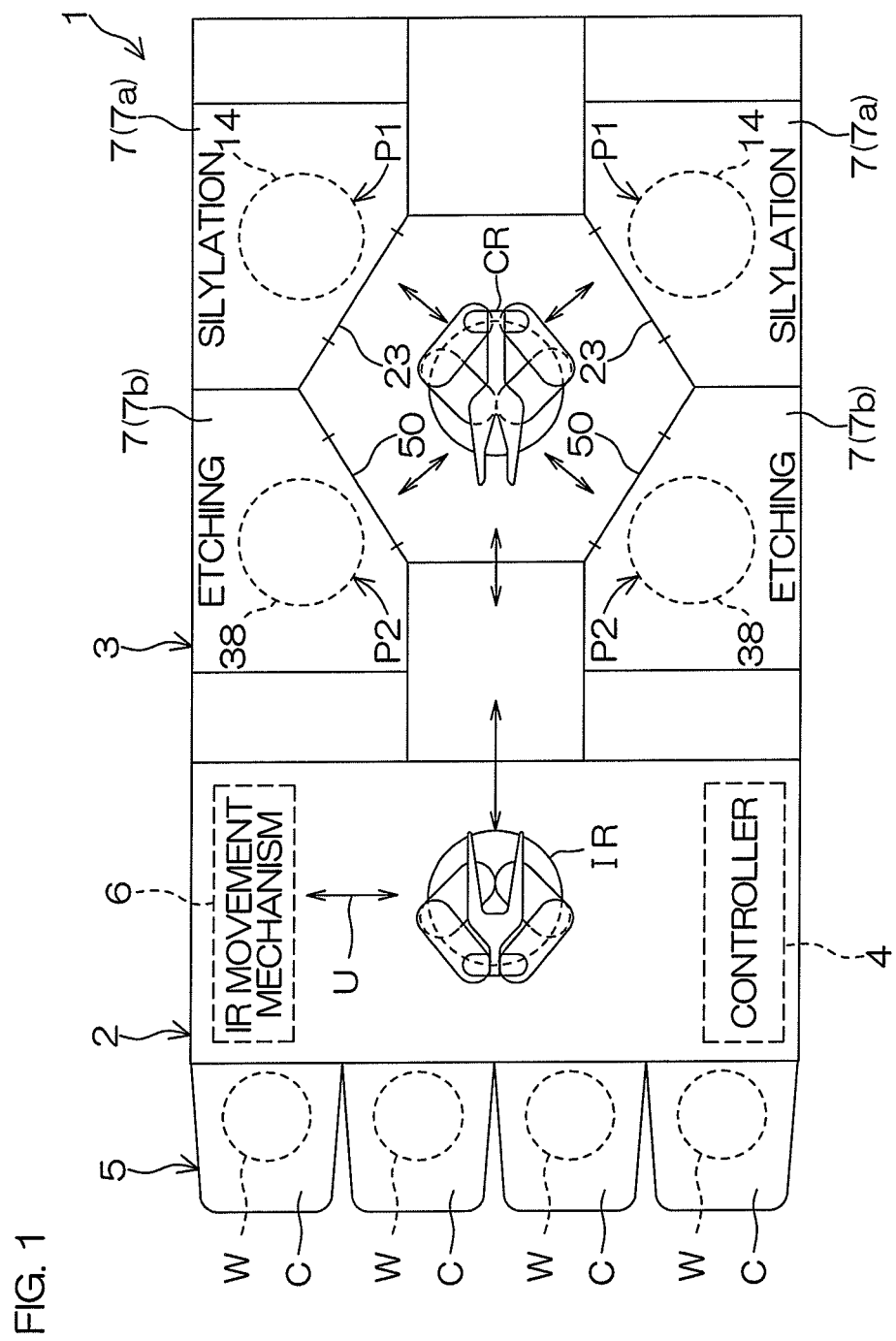
FIG. 1 is a schematic plan view showing a layout in a substrate treatment apparatus according to a first embodiment of the present invention.

FIG. 1 is a schematic plan view showing a layout in a substrate treatment apparatus 1 according to a first embodiment of the present invention.

The substrate treatment apparatus 1 is a substrate treatment apparatus of a single substrate treatment type which is adapted to treat a single round substrate W (e.g., a semiconductor wafer or the like) with a treatment liquid such as a chemical liquid or a rinse liquid at a time. The substrate treatment apparatus 1 includes an indexer block 2, a treatment block 3 connected to the indexer block 2, and a controller 4 which controls the operations of devices provided in the substrate treatment apparatus 1 and valve opening/closing operations.

The indexer block 2 includes a carrier retaining portion 5, an indexer robot IR, and an IR movement mechanism 6. The carrier retaining portion 5 retains carriers C each capable of accommodating a plurality of substrates W. The carriers C are retained in the carrier retaining portion 5 as aligned in a horizontal carrier alignment direction U. The IR movement mechanism 6 horizontally moves the indexer robot IR in the carrier alignment direction U. The indexer robot IR performs a loading operation for loading a substrate W into one of the carriers C retained in the carrier retaining portion 5 and an unloading operation for unloading a substrate W from one of the carriers C.

On the other hand, the treatment block 3 includes a plurality of treatment units 7 (e.g., four or more treatment units) each adapted to treat a substrate W, and a center robot CR. These treatment units 7 are disposed around the center robot CR as seen in plan. The treatment units 7 include silylation units 7a each adapted to silylate a substrate W, and etching units 7b each adapted to etch a substrate W. The center robot CR performs a loading operation for loading a substrate W into any one of the treatment units 7 and an unloading operation for unloading a substrate W from any one of the treatment units 7. Further, the center robot CR transports a substrate W between the treatment units 7. The center robot CR is adapted to receive a substrate W from the indexer robot IR, and transfer a substrate W to the indexer robot IR. The indexer robot IR and the center robot CR are controlled by the controller 4.

Figure 2:
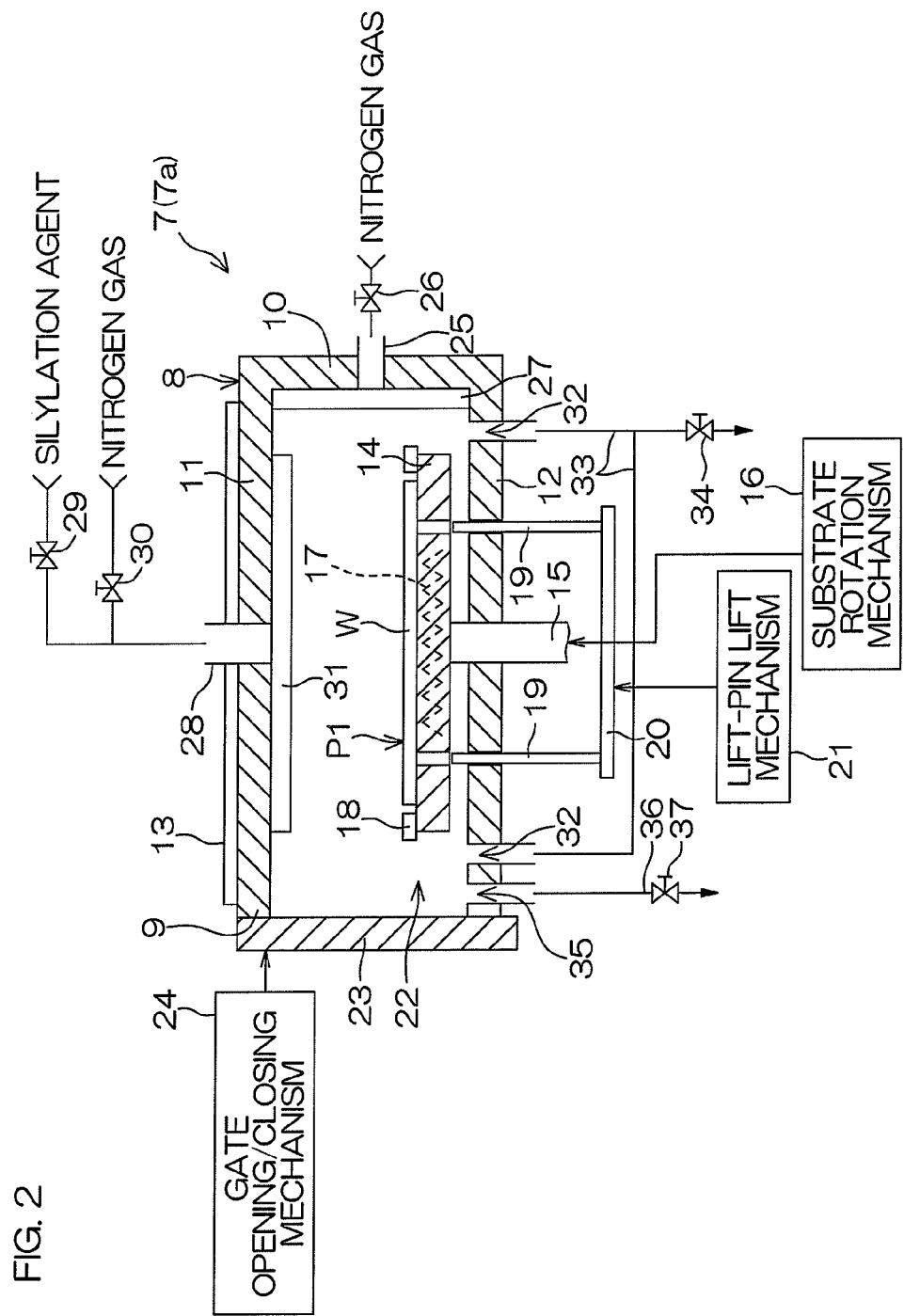
FIG. 2 is a schematic diagram schematically showing the construction of a silylation unit according to the first embodiment of the present invention.

FIG. 2 is a schematic diagram schematically showing the construction of each of the silylation units 7a according to the first embodiment of the present invention. The schematic construction of the silylation unit 7a and an exemplary substrate treatment to be performed in the silylation unit 7a will be described. First, the schematic construction of the silylation unit 7a will be described.

The silylation unit 7a includes a chamber 8. The chamber 8 is, for example, of a rectangular box shape. The chamber 8 includes two side walls 9 and 10 horizontally opposed to each other, and a top wall 11 and a bottom wall 12 vertically opposed to each other. The silylation unit 7a further includes a cooling device 13 disposed on an outer surface (upper surface) of the top wall 11. The chamber 8 is cooled by the cooling device 13. The cooling device 13 is, for example, a cooling device of a water cooled type.

The silylation unit 7a further includes a substrate holding base 14 provided in the chamber 8. In the first embodiment, a substrate holding unit is defined by the substrate holding base 14 and a spin chuck 38 to be described later. A single substrate W loaded into the chamber 8 is placed on the substrate holding base 14 and, in this state, held at a holding position P1 (silylation position) on the substrate holding base 14. The substrate holding base 14 is fixed to an upper end of a vertically extending rotation shaft 15. A substrate rotation mechanism 16 which rotates the rotation shaft 15 about a center axis of the rotation shaft 15 is connected to the rotation shaft 15. The substrate rotation mechanism 16 is, for example, a mechanism including a motor.

A heater 17 which heats the substrate W held on the substrate holding base 14 is embedded in the substrate holding base 14. A hot ring 18 which evenly keeps the temperature of the substrate W during the heating by the heater 17 is provided on the substrate holding base 14. The hot ring 18 has a ring shape which surrounds the substrate holding position P1 on the substrate holding base 14.

A plurality of lift pins 19 (e.g., three lift pins 19) which move up and down the substrate W with respect to the substrate holding base 14 are provided in association with the substrate holding base 14. The lift pins 19 extend through the bottom wall 12 of the chamber 8 to be supported by a common support member 20 outside the chamber 8. A lift-pin lift mechanism 21 including a cylinder is connected to the support member 20. The lift-pin lift mechanism 21 moves up and down the lift pins 19 together between a position at which distal ends of the lift pins 19 project above the substrate holding base 14 and a position at which the distal ends of the lift pins 19 are retracted below the substrate holding base 14.

A gate 22 through which a substrate W is loaded into and unloaded from the chamber 8 is provided in the side wall 9 (the left side wall in FIG. 2) of the chamber 8. A gate shutter 23 which opens and closes the gate 22 is provided outside the side wall 9. A gate opening/closing mechanism 24 including a cylinder is connected to the gate shutter 23. The gate opening/closing mechanism 24 moves the gate shutter 23 between a closed position at which the gate shutter 23 tightly closes the gate 22 in intimate contact with an outer surface of the side wall 9 and an open position at which the gate shutter 23 is spaced laterally downward from the side wall 9 to widely open the gate 22.

A lateral inlet pipe 25 through which nitrogen gas is supplied as an exemplary inert gas into the chamber 8 is provided in the side wall 10 (the right side wall in FIG. 2) of the chamber 8. The nitrogen gas is supplied to the lateral inlet pipe 25 through a lateral gas valve 26. The lateral inlet pipe 25 extends through the side wall 10. An end face of the lateral inlet pipe 25 facing the inside of the chamber 8 is generally flush with an interior surface of the side wall 10. A diffuser plate 27 having a size such as to generally entirely cover the interior surface of the side wall 10 is provided on the interior surface of the side wall 10. The diffuser plate 27 has a multiplicity of outlets (not shown) facing the inside of the chamber 8. The nitrogen gas supplied to the lateral inlet pipe 25 is diffused to flow out of the multiplicity of outlets of the diffuser plate 27. Therefore, the nitrogen gas supplied to the lateral inlet pipe 25 is showered to be diffused as having a generally uniform flow rate in a plane parallel to the interior surface of the side wall 10 in the chamber 8.

A silylation agent inlet pipe 28 (silylation agent supply unit) through which a silylation agent vapor and nitrogen gas are introduced into the chamber 8 extends through the top wall 11 of the chamber 8. The silylation agent and the nitrogen gas are supplied to the silylation agent inlet pipe 28 through a silylation agent valve 29 and an upper gas valve 30. An end face of the silylation agent inlet pipe 28 facing the inside of the chamber 8 is generally flush with an interior surface (lower surface) of the top wall 11. A disk-shaped diffuser plate 31 having a greater diameter than the substrate W is provided on the interior surface of the top wall 11. The diffuser plate 31 has a multiplicity of outlets (not shown) facing the inside of the chamber 8. The silylation agent and the nitrogen gas supplied to the silylation agent inlet pipe 28 is diffused to flow out of the multiplicity of outlets of the diffuser plate 31. Therefore, the silylation agent and the nitrogen gas supplied to the silylation agent inlet pipe 28 is showered to be diffused as having a generally uniform flow rate in a plane parallel to the interior surface of the top wall 11 in the chamber 8.

Examples of the silylation agent include TMSI (N-trimethylsilylimidazole), BSTFA (N,O-bis(trimethylsilyl)trifluoroacetamide), BSA (N,O-bis(trimethylsilyl)acetamide), MSTFA (N-methyl-N-trimethylsilyltrifluoroacetamide), TMSDMA (N-trimethylsilyldimethylamine), TMSDEA (N-trimethylsilyldiethylamine), MTMSA (N,O-bis(trimethylsilyl)trifluoroacetamide), TMCS (trimethylchlorosilane) with base, HMDS (hexamethyldisilazane), amines each having a hydrophobic group, organic silicon compounds, TMS (tetramethylsilane), fluorinated alkylchlorosilanes, alkyldisilazanes, dimethylsilyldimethylamine, dimethylsilyldiethylamine, bis(dimethylamino)dimethylsilane and organosilane compounds. Vapor of any one of these silylation agents is supplied to the silylation agent inlet pipe 28. The silylation agent vapor to be supplied to the silylation agent inlet pipe 28 may contain minute particles of the silylation agent alone, or contain the minute silylation agent particles and a carrier gas (e.g., an inert gas) in combination.

An annular peripheral gas outlet 32 surrounding the substrate holding base 14 as seen in plan is provided in the bottom wall 12 of the chamber 8. A gas outlet pipe 33 is connected to the peripheral gas outlet 32 at its proximal end, and connected to an evacuation source (not shown) at its distal end. A peripheral gas outlet valve 34 is provided in the gas outlet pipe 33. With the peripheral gas outlet valve 34 being open, the chamber 8 is evacuated through the peripheral gas outlet 32. With the peripheral gas outlet valve 34 being closed, the evacuation of the chamber 8 through the peripheral gas outlet 32 is stopped.

A generally rectangular gate side gas outlet 35 as seen in plan is provided on an outer side of the peripheral gas outlet 32 in the bottom wall 12 of the chamber 8 as extending along the side wall 9. A gas outlet pipe 36 is connected to the gate side gas outlet 35 at its proximal end, and connected to the evacuation source (not shown) at its distal end. A gate side gas outlet valve 37 is provided in the gas outlet pipe 36. With the gate side gas outlet valve 37 being open, the chamber 8 is evacuated through the gate side gas outlet 35. With the gate side gas outlet valve 37 being closed, the evacuation of the chamber 8 through the gate side gas outlet 35 is stopped.

Next, an exemplary substrate treatment to be performed for treating a substrate W in the silylation unit 7a will be described.

The center robot CR loads the substrate W into the silylation unit 7a. Prior to the loading of the substrate W into the silylation unit 7a, the gate opening/closing mechanism 24 is driven by the controller 4. Thus, the gate-shutter 23 is located at the open position to open the gate 22. With the gate 22 being open, the lateral gas valve 26 is opened by the controller 4 to supply the nitrogen gas into the chamber 8 from the lateral inlet pipe 25. Further, the gate side gas outlet valve 37 is opened by the controller 4 to evacuate the chamber 8 through the gate side gas outlet 35. Thus, a nitrogen gas flow flowing toward the gate 22 from the side wall 10 located on a side of the substrate holding base 14 opposite from the gate 22 is generated in the chamber 8, whereby an ambient atmosphere outside the chamber 8 is prevented from flowing into the chamber 8. While the gate 22 is open, the silylation agent valve 29, the upper gas valve 30 and the peripheral gas outlet valve 34 are closed.

Prior to the loading of the substrate W into the silylation unit 7a, the lift-pin lift mechanism 21 is driven by the controller 4. Thus, the lift pins 19 are located at the position at which their distal ends project above the substrate holding base 14. Then, the substrate W is loaded into the chamber 8 by the center robot CR. The substrate W loaded into the chamber 8 is placed on the lift pins 19 by the center robot CR. Thereafter, the center robot CR is retracted from the chamber 8. After the retraction of the center robot CR from the chamber 8, the gate opening/closing mechanism 24 is driven by the controller 4. Thus, the gate shutter 23 is located at the closed position, so that the gate 22 is tightly closed by the gate shutter 23.

After the gate 22 is tightly closed, the controller 4 closes the lateral gas valve 26 and the gate side gas outlet valve 37, and opens the upper gas valve 30 and the peripheral gas outlet valve 34. Thus, the nitrogen gas is introduced into the chamber 8 from the silylation agent inlet pipe 28, while the chamber 8 is rapidly evacuated through the peripheral gas outlet 32. As a result, the atmosphere in the chamber 8 is replaced with the nitrogen gas introduced through the silylation agent inlet pipe 28 in a short period of time. Simultaneously with the replacement with the nitrogen gas atmosphere in the chamber 8, the lift-pin lift mechanism 21 is driven by the controller 4. Thus, the lift pins 19 are lowered to the position at which their distal ends are retracted below the substrate holding base 14. By the lowering of the lift pins 19, the substrate W is transferred from the lift pins 19 onto the substrate holding base 14. Thus, the substrate W is held at the holding position P1 on the substrate holding base 14.

After the substrate W is transferred onto the substrate holding base 14, the controller 4 closes the upper gas valve 30, and opens the silylation agent valve 29. Thus, the silylation agent vapor is introduced into the chamber 8 from the silylation agent inlet pipe 28, and then supplied onto an upper surface of the substrate W. Simultaneously with the supply of the silylation agent, the substrate rotation mechanism 16 is driven by the controller 4 to rotate the substrate W. Thus, the silylation agent is evenly supplied onto the entire upper surface of the substrate W. Simultaneously with the supply of the silylation agent, the heater 17 is driven by the controller 4 to heat the substrate W up to a temperature higher than an ordinary temperature (which is equal to the room temperature, e.g., 20° C. to 30° C.). The substrate W held on the substrate holding base 14 is silylated by the supply of the silylation agent.

After the supply of the silylation agent is continued for a predetermined period, the lift-pin lift mechanism 21 is driven by the controller 4. Thus, the lift pins 19 are moved up to lift the substrate W up to a position at which the substrate W is spaced upward from the substrate holding base 14 (e.g., a position at which the substrate W can be transferred between the center robot CR and the lift pins 19). Then, the controller 4 closes the silylation agent valve 29, and opens the upper gas valve 30. Thus, the nitrogen gas is introduced at the ordinary temperature into the chamber 8 from the silylation agent inlet pipe 28, and then supplied onto the upper surface of the substrate W. As a result, the substrate W heated up to the higher temperature is cooled by the nitrogen gas supplied at the ordinary temperature. The peripheral gas outlet valve 34 is kept open during the cooling of the substrate W with the nitrogen gas. Therefore, the atmosphere in the chamber 8 is rapidly replaced with the nitrogen gas introduced into the chamber 8 from the silylation agent inlet pipe 28.

After the replacement with the nitrogen gas atmosphere in the chamber 8, the gate opening/closing mechanism 24 is driven by the controller 4. Thus, the gate shutter 23 is located at the open position to open the gate 22. After the gate 22 is opened, the controller 4 closes the upper gas valve 30 and the peripheral gas outlet valve 34, and opens the lateral gas valve 26 and the gate side gas outlet valve 37. Thus, a nitrogen gas flow flowing toward the gate 22 from the side wall 10 is generated in the chamber 8, whereby the ambient atmosphere outside the chamber 8 is prevented from flowing into the chamber 8. In this state, the substrate W supported by the lift pins 19 is unloaded from the chamber 8 by the center robot CR.

Figure 3:
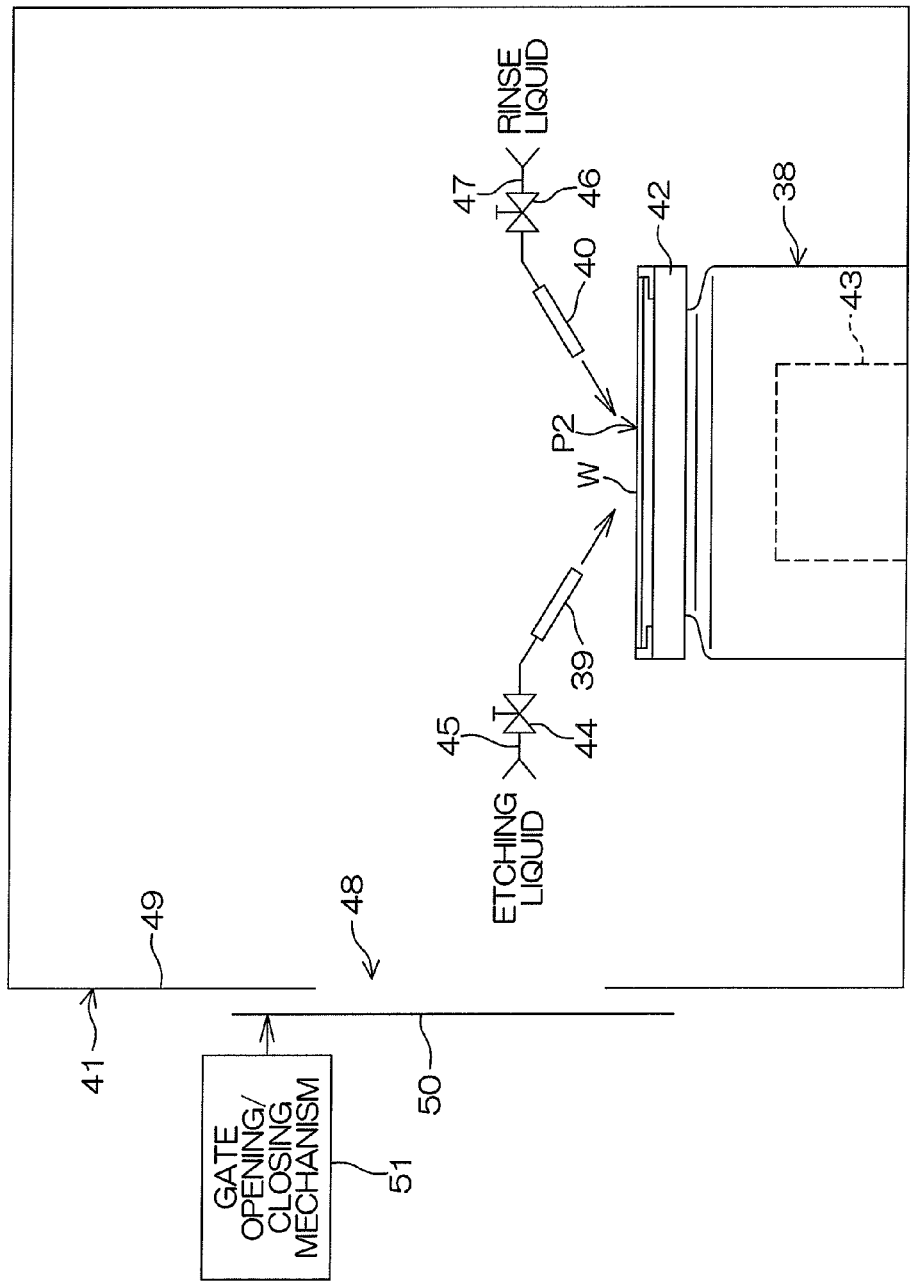
FIG. 3 is a schematic diagram schematically showing the construction of an etching unit according to the first embodiment of the present invention.

FIG. 3 is a schematic diagram schematically showing the construction of each of the etching units 7b according to the first embodiment of the present invention. The schematic construction of the etching unit 7b and an exemplary substrate treatment to be performed in the etching unit 7b will be described. First, the schematic construction of the etching unit 7b will be described.

The etching unit 7b includes a spin chuck 38 (substrate holding unit) which horizontally holds and rotates a substrate W, an etching agent nozzle 39 (etching agent supply unit) which supplies an etching liquid as an etching agent onto an upper surface of the substrate W held by the spin chuck 38, a rinse liquid nozzle 40 which supplies a rinse liquid onto the upper surface of the substrate W held by the spin chuck 38, and a chamber 41 which accommodates the spin chuck 38, the etching agent nozzle 39 and the rinse liquid nozzle 40.

The spin chuck 38 includes a disk-shaped spin base 42 which horizontally holds the substrate W and is rotatable about a vertical axis extending through the center of the substrate W, and a spin motor 43 which rotates the spin base 42 about the vertical axis. The spin chuck 38 may be a clamping chuck which horizontally clamps the substrate W to horizontally hold the substrate W, or a vacuum chuck which sucks a back surface (lower surface) of the substrate W formed with no device to horizontally hold the substrate W. In the first embodiment, the spin chuck 38 is the clamping chuck. The spin chuck 38 horizontally holds the substrate W at a holding position P2. In the first embodiment, the holding position P2 is an etching position.

The etching agent nozzle 39 is connected to an etching agent supply pipe 45 in which an etching agent valve 44 is provided. The supply of the etching liquid to the etching agent nozzle 39 is controlled by the opening and closing of the etching agent valve 44. The etching liquid supplied to the etching agent nozzle 39 is spouted toward a center portion of the upper surface of the substrate W held by the spin chuck 38. Examples of the etching liquid to be supplied to the etching agent nozzle 39 include a liquid mixture containing hydrofluoric acid and ethylene glycol kept at a temperature ranging from the ordinary temperature to 70° C., a phosphoric acid aqueous solution kept at a higher temperature (e.g., 120° C. to 190° C.), and hydrofluoric acid kept at the ordinary temperature or a higher temperature (higher than the ordinary temperature).

The rinse liquid nozzle 40 is connected to a rinse liquid supply pipe 47 in which a rinse liquid valve 46 is provided. The supply of the rinse liquid to the rinse liquid nozzle 40 is controlled by the opening and closing of the rinse liquid valve 46. The rinse liquid supplied to the rinse liquid nozzle 40 is spouted toward the center portion of the upper surface of the substrate W held by the spin chuck 38. Examples of the rinse liquid to be supplied to the rinse liquid nozzle 40 include pure water (deionized water), carbonated water, electrolytically ionized water, hydrogen water, ozone water and a diluted hydrochloric acid aqueous solution (e.g., having a concentration of about 10 to about 100 ppm).

The chamber 41 includes a partition wall 49 formed with an opening 48 through which the substrate W is loaded into and unloaded from the chamber 41, and a gate shutter 50 which covers the opening 48. The gate shutter 50 is disposed outside the partition wall 49. A gate opening/closing mechanism 51 including a cylinder is connected to the gate shutter 50. The gate opening/closing mechanism 51 moves the gate shutter 50 between a closed position at which the gate shutter 50 tightly closes the opening 48 in intimate contact with an outer surface of the partition wall 49 and an open position at which the gate shutter 50 is spaced laterally downward from the partition wall 49 to widely open the opening 48.

Next, an exemplary substrate treatment to be performed for treating a substrate W in the etching unit 7b will be described.

The center robot CR loads the substrate W into the etching unit 7b. Prior to the loading of the substrate W into the etching unit 7b, the gate opening/closing mechanism 51 is driven by the controller 4. Thus, the gate-shutter 50 is located at the open position to uncover the opening 48 of the chamber 41. Thereafter, the center robot CR loads the substrate W into the chamber 41 to place the substrate W on the spin chuck 38. After the substrate W is placed on the spin chuck 38 by the center robot CR, the controller 4 retracts the center robot CR from the chamber 41. Thereafter, the gate opening/closing mechanism 51 is driven by the controller 4 to locate the gate shutter 50 at the closed position. Thus, the opening 48 of the chamber 41 is tightly closed by the gate shutter 50. After the closing of the opening 48 of the chamber 41, the controller 4 controls the spin motor 43 to rotate the substrate W held by the spin chuck 38.

Then, an etching process is performed to etch the substrate W by supplying the etching liquid to the substrate W. More specifically, the controller 4 opens the etching agent valve 44 to spout the etching liquid toward the center portion of the upper surface of the substrate W held by the spin chuck 38 from the etching agent nozzle 39, while causing the spin chuck 38 to rotate the substrate W. The etching liquid spouted from the etching agent nozzle 39 is supplied onto the center portion of the upper surface of the substrate W, and receives a centrifugal force generated by the rotation of the substrate W to spread outward on the upper surface of the substrate W. Thus, the etching liquid is supplied to the entire upper surface of the substrate W to etch the entire upper surface of the substrate W. After a lapse of a predetermined period from the opening of the etching agent valve 44, the controller 4 closes the etching agent valve 44 to stop spouting the etching liquid from the etching agent nozzle 39.

Subsequently, a rinsing process is performed to rinse away the etching liquid adhering to the substrate W by supplying the rinse liquid to the substrate W. More specifically, the controller 4 opens the rinse liquid valve 46 to supply the rinse liquid toward the center portion of the upper surface of the substrate W held by the spin chuck 38 from the rinse liquid nozzle 40, while causing the spin chuck 38 to rotate the substrate W. The rinse liquid spouted from the rinse liquid nozzle 40 is supplied onto the center portion of the upper surface of the substrate W, and receives a centrifugal force generated by the rotation of the substrate W to spread outward on the upper surface of the substrate W. Thus, the rinse liquid is supplied to the entire upper surface of the substrate W to rinse away the etching liquid adhering to the substrate W. After a lapse of a predetermined period from the opening of the rinse liquid valve 46, the controller 4 closes the rinse liquid valve 46 to stop spouting the rinse liquid from the rinse liquid nozzle 40.

Then, a drying (spin dry) process is performed to dry the substrate W. More specifically, the controller 4 controls the spin motor 43 to rotate the substrate W at a higher rotation speed (e.g., several thousands rpm). Therefore, a greater centrifugal force acts on the rinse liquid adhering to the substrate W to spin off the rinse liquid around the substrate W. Thus, the rinse liquid is removed from the substrate W to dry the substrate W. After the drying process is performed for a predetermined period, the controller 4 controls the spin motor 43 to cause the spin chuck 38 to stop rotating the substrate W. Thereafter, the gate opening/closing mechanism 51 is driven by the controller 4 to locate the gate shutter 50 at the open position. Thus, the opening 48 of the chamber 41 is uncovered. Then, the substrate W held by the spin chuck 38 is unloaded from the chamber 41 by the center robot CR.

FIGS. 4(a) to 4(d) are diagrams for explaining an exemplary substrate treatment to be performed by the substrate treatment apparatus 1 according to the first embodiment of the present invention. An exemplary selective etching process will hereinafter be described, which is performed on a substrate W having an $SiO_2$ film and an SiN film respectively formed as an exemplary oxide film and an exemplary nitride film on a front surface thereof for selectively removing the SiN film by supplying the etching agent to the front surface of the substrate W. The oxide film formed on the front surface of the substrate W may be a film (TEOS film) formed by using TEOS (tetraethyl orthosilicate). In the following description, reference will be made to FIG. 1 and FIGS. 4(a) to 4(d).

An untreated substrate W accommodated in one of the carriers C retained in the carrier retaining portion 5 is transported out of the carrier C by the indexer robot IR. Then, the substrate W transported out of the carrier C is transferred from the indexer robot IR to the center robot CR. The center robot CR loads the untreated substrate W received from the indexer robot IR into one of the silylation units 7a.

In the silylation unit 7a, as shown in FIG. 4(a), the silylation agent vapor is supplied to the substrate W in the aforementioned manner to silylate the substrate W (silylation process, silylation step). More specifically, an HMDS vapor is supplied as an exemplary silylation agent to a front surface of the substrate W held at the holding position P1 on the substrate holding base 14, whereby the front surface of the substrate W is silylated. After the silylation of the front surface of the substrate W, the substrate W located in the silylation unit 7a is unloaded from the silylation unit 7a by the center robot CR. The substrate W unloaded from the silylation unit 7a is loaded into one of the etching units 7b by the center robot CR.

In the etching unit 7b, as shown in FIG. 4(b), the etching agent is supplied to the substrate W in the aforementioned manner to etch the substrate W (etching process, etching step). More specifically, a liquid mixture containing hydrofluoric acid and ethylene glycol is supplied as an exemplary etching agent onto the front surface of the substrate W held at the holding position P2 on the spin chuck 38. Thus, the SiN film formed on the front surface of the substrate W is selectively removed. Thereafter, as shown in FIG. 4(c), the deionized water is supplied as an exemplary rinse liquid onto the front surface of the substrate W held at the holding position P2 on the spin chuck 38 to rinse away the etching agent adhering to the front surface of the substrate W (rinsing process, rinsing step). Then, as shown in FIG. 4(d), the rinse liquid adhering to the substrate W is removed from the substrate W by the higher speed rotation of the substrate W. Thus, the substrate W held at the holding position P2 on the spin chuck 38 is dried (drying process, drying step).

After the drying process is performed in the etching unit 7b, the substrate W is unloaded from the etching unit 7b by the center robot CR. Then, the substrate W unloaded from the etching unit 7b is transferred from the center robot CR to the indexer robot IR. The indexer robot IR transports the treated substrate W received from the center robot CR into the carrier C retained in the carrier retaining portion 5. Thus, the substrate treatment apparatus 1 completes the process sequence. The controller 4 repeatedly performs this process sequence to treat a plurality of substrates W one by one.

FIG. 5 is a graph showing a relationship between an etching period, an etching amount and a selectivity observed when a substrate W not subjected to the silylation process was etched. FIG. 6 is a graph showing a relationship between the etching period, the etching amount and the selectivity observed when a substrate subjected to the silylation process was etched. The graph of FIG. 5 relates to a comparative example, while the graph of FIG. 6 relates to an inventive example.

The etching amount and the selectivity shown in each of FIGS. 5 and 6 were observed when a front surface of the substrate W formed with the $SiO_2$ film and the SiN film was etched by supplying an aqueous solution containing hydrofluoric acid and ethylene glycol onto the front surface of the substrate W. The aqueous solution containing hydrofluoric acid and ethylene glycol for the etching of the substrate W was prepared by mixing 50% hydrofluoric acid (aqueous solution of hydrogen fluoride) and 100% ethylene glycol in a mixing ratio of 4:96 (hydrofluoric acid:ethylene glycol=4:96), and the temperature thereof was adjusted at 60° C.

Particularly, the etching amount and the selectivity shown in FIG. 6 were observed when HMDS was supplied to the substrate W before the etching liquid was supplied to the substrate W. That is, the etching amount and the selectivity shown in FIG. 5 were observed when a substrate W not subjected to the silylation was etched, and the etching amount and the selectivity shown in FIG. 6 were observed when a substrate W subjected to the silylation was etched.

Where the substrate W not subjected to the silylation was etched, as shown in FIG. 5, the $SiO_2$ etching amount and the SiN etching amount were increased with the treatment period, and the change rate was generally constant. In the etching of the substrate W not subjected to the silylation, therefore, the selectivity (nitride removal amount/oxide removal amount) was generally constant irrespective of the treatment period.

Where the substrate W subjected to the silylation was etched, as shown in FIG. 6, the SiN etching amount was increased with the treatment period, but the $SiO_2$ etching amount was generally constant irrespective of the treatment period. In the etching of the substrate W subjected to the silylation, therefore, the selectivity was increased with the treatment period.

In comparison, the SiN etching amount observed in the etching of the substrate W not subjected to the silylation and the SiN etching amount observed in the etching of the substrate W subjected to the silylation are substantially equal to each other if the etching is performed for the same treatment period. On the other hand, the $SiO_2$ etching amount observed in the etching of the substrate W subjected to the silylation is smaller than the $SiO_2$ etching amount observed in the etching of the substrate W not subjected to the silylation. This is because the oxide film has hydroxyl groups (OH groups) and is therefore reactive with the silylation agent, but the nitride film has no hydroxyl group and is therefore nonreactive with the silylation agent. Where the supply of the silylation agent to the substrate W precedes the supply of the etching liquid to the substrate W, therefore, the etching of the oxide film is suppressed by the supply of the silylation agent to the substrate W. Thus, the selectivity can be improved by supplying the etching liquid to the substrate W after supplying the silylation agent to the substrate W.

In the first embodiment, as described above, the etching liquid is supplied as the etching agent to the substrate W after the silylation agent is supplied to the substrate W. Therefore, the silylated substrate W is etched. As described above, the etching of the oxide film can be suppressed by the silylation of the substrate W formed with the oxide film and the nitride film. Thus, the selectivity can be improved by the etching of the silylated substrate W.

In the first embodiment, the silylation agent to be supplied to the substrate W contains the nonaqueous silylation agent as an exemplary silylation agent. Therefore, the nonaqueous silylation agent is supplied to the substrate W. Further, the aqueous etching liquid, e.g., the aqueous solution of hydrofluoric acid and ethylene glycol, is supplied to the substrate W. In the first embodiment, therefore, the supply of the aqueous etching agent to the substrate W follows the supply of the nonaqueous silylation agent to the substrate W. In this case, the nonaqueous silylation agent adhering to the substrate W is insoluble in the etching liquid supplied to the substrate W. Therefore, the etching of the oxide film can be continuously suppressed. This substantially prevents the reduction in selectivity.

Second Embodiment

Next, a second embodiment of the present invention will be described. A major difference between the second embodiment and the first embodiment described above is that the treatment units have different constructions. More specifically, the treatment units include silylation/etching units each adapted to silylate a substrate W and etch the substrate W in the second embodiment, although the treatment units include the silylation units each adapted to silylate the substrate W and the etching units each adapted to etch the substrate W in the first embodiment. In FIGS. 7 to 10($d$), components equivalent to those shown in FIGS. 1 to 6 are designated by the same reference characters as in FIGS. 1 to 6, and duplicate description will be omitted.

Figure 7:
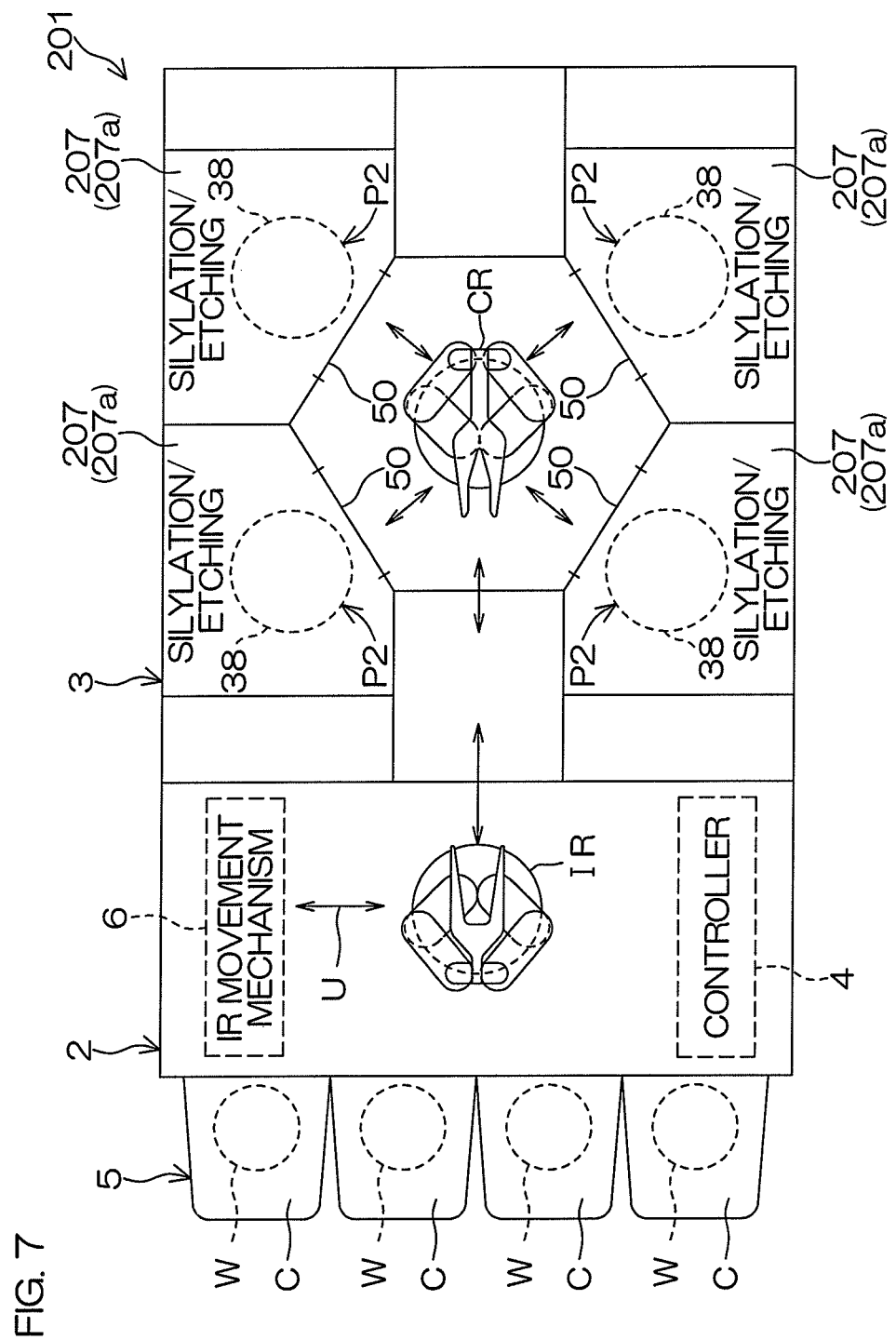
FIG. 7 is a schematic plan view showing a layout in a substrate treatment apparatus according to a second embodiment of the present invention.

FIG. 7 is a schematic plan view showing a layout in a substrate treatment apparatus 201 according to the second embodiment of the present invention.

The substrate treatment apparatus 201 according to the second embodiment has substantially the same construction as the substrate treatment apparatus 1 according to the first embodiment except for the treatment units. More specifically, the substrate treatment apparatus 201 includes a plurality of treatment units 207 instead of the treatment units 7 of the first embodiment. The treatment units 207 are disposed around a center robot CR as seen in plan. The treatment units 207 include silylation/etching units 207a each adapted to silylate a substrate W and etch the substrate W. In the second embodiment, the treatment units 207 are all silylation/etching units 207a.

Figure 8:
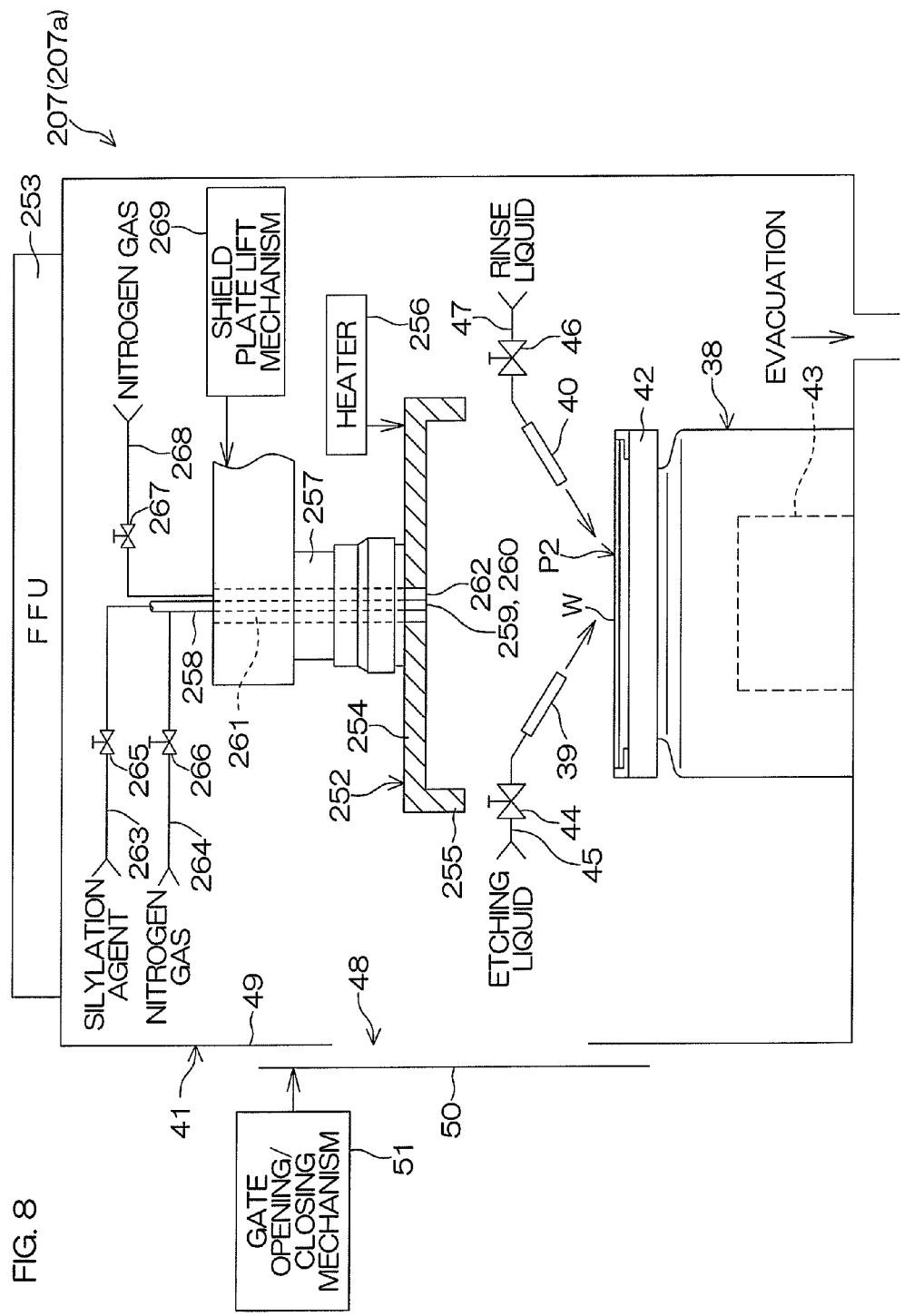
FIG. 8 is a schematic diagram schematically showing the construction of a silylation/etching unit according to the second embodiment of the present invention.
Figure 9:
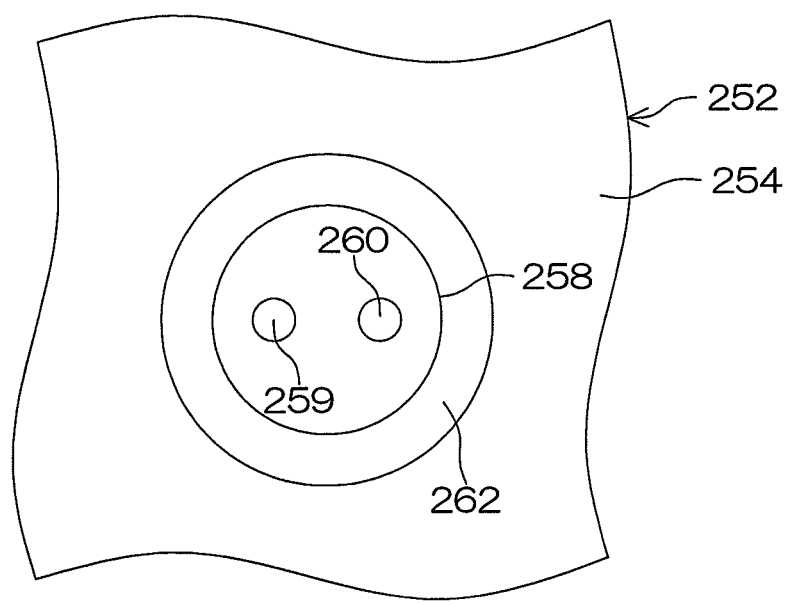
FIG. 9 is a bottom view illustrating a shield plate and an arrangement related to the shield plate according to the second embodiment of the present invention.

FIG. 8 is a schematic diagram schematically showing the construction of each of the silylation/etching units 207a according to the second embodiment of the present invention. FIG. 9 is a bottom view illustrating a shield plate 252 and an arrangement related to the shield plate according to the second embodiment of the present invention. In the following description, reference will be made to FIG. 8 and, as required, to FIG. 9.

The silylation/etching units 207a each include a spin chuck 38, an etching agent nozzle 39, a rinse liquid nozzle 40, and a chamber 41. In the second embodiment, a substrate holding unit is defined by the spin chuck 38. The silylation/etching unit 207a further includes a shield plate 252 disposed above the spin chuck 38 in the chamber 41, a fan/filter unit 253 (FFU 253) which supplies clean air into the chamber 41 from the top of the chamber 41, and an evacuation mechanism (not shown) which evacuates the chamber 41 from the bottom of the chamber 41. The FFU 253 and the evacuation mechanism are constantly driven, so that a gas flow from the top of the chamber 41 to the bottom of the chamber 41 is generated in the chamber 41.

The shield plate 252 includes a disk portion 254 horizontally disposed, a tubular portion 255 provided along an outer periphery of the disk portion 254, and a heater 256 connected to the disk portion 254. The tubular portion 255 vertically extends downward from the outer periphery of the disk portion 254. The tubular portion 255 has a hollow cylindrical shape. The disk portion 254 and the tubular portion 255 are coaxial with each other. The disk portion 254 has a greater diameter than the substrate W. The tubular portion 255 has an inner diameter that is greater than the diameter of the spin base 42. The disk portion 254 is connected to a lower end of a support shaft 257 to assume a horizontal posture. The shield plate 252 has a center axis which is aligned with a rotation axis of the spin chuck 38. The shield plate 252 is disposed with a lower surface of the disk portion 254 thereof kept horizontal. With the substrate W held by the spin chuck 38, the lower surface of the disk portion 254 is opposed to an upper surface of the substrate W.

The disk portion 254 has a through-hole vertically extending through a center portion thereof. The through-hole opens in a center portion of the lower surface of the disk portion 254. The support shaft 257 is hollow, and has an inside space which communicates with the through-hole. A silylation agent inlet pipe 258 (silylation agent supply unit) is inserted in the support shaft 257 in a noncontact state with its lower end reaching the through-hole. As shown in FIG. 9, a silylation agent outlet port 259 which spouts the silylation agent and a center gas outlet port 260 which spouts the nitrogen gas are provided at the lower end of the silylation agent inlet pipe 258. Further, a tubular gas supply passage 261 is provided between the support shaft 257 and the silylation agent inlet pipe 258 as surrounding the silylation agent inlet pipe 258. The gas supply passage 261 has a lower end which opens in the lower surface of the disk portion 254. As shown in FIG. 9, the gas supply passage 261 has an annular gas outlet port 262 provided at the lower end thereof for spouting the nitrogen gas.

A silylation agent supply pipe 263 and a first gas supply pipe 264 are connected to the silylation agent inlet pipe 258. The silylation agent and the nitrogen gas are supplied to the silylation agent inlet pipe 258 through the silylation agent supply pipe 263 and the first gas supply pipe 264, respectively. The silylation agent to be supplied to the silylation agent inlet pipe 258 may be a silylation agent vapor, or may be a silylation agent liquid. A silylation agent valve 265 which controls the on and off of the supply of the silylation agent to the silylation agent inlet pipe 258 is provided in the silylation agent supply pipe 263, and a first gas valve 266 which controls the on and off of the supply of the nitrogen gas to the silylation agent inlet pipe 258 is provided in the first gas supply pipe 264.

A second gas supply pipe 268 in which a second gas valve 267 is provided is connected to an upper end of the support shaft 257. The nitrogen gas is supplied to the gas supply passage 261 through the second gas supply pipe 268. The nitrogen gas supplied to the gas supply passage 261 is spouted downward from the annular gas outlet port 262.

The support shaft 257 is connected to a shield plate lift mechanism 269. The shield plate lift mechanism 269 moves up and down the support shaft 257 and the shield plate 252 together between an adjacent position (a position shown in FIG. 10(a)) at which the lower surface of the disk portion 254 is located adjacent the upper surface of the substrate W held by the spin chuck 38 and a retracted position (a position shown in FIG. 8) at which the lower surface of the disk portion 254 is significantly retracted above the spin chuck 38. With the shield plate 252 located at the adjacent position, the lower surface of the disk portion 254 is located adjacent the upper surface of the substrate W, and the tubular portion 255 of the shield plate 252 surrounds the substrate W.

FIGS. 10(a) to 10(d) are diagrams for explaining an exemplary substrate treatment to be performed by the substrate treatment apparatus 201 according to the second embodiment of the present invention. An exemplary selective etching process will hereinafter be described, which is performed on a substrate W having an SiO₂ film and an SiN film respectively formed as an exemplary oxide film and an exemplary nitride film on a front surface thereof for selectively removing the SiN film by supplying an etching liquid as an etching agent to the front surface of the substrate W. In the following description, reference will be made to FIGS. 7, 8 and 10(a) to 10(d).

An untreated substrate W accommodated in one of the carriers C retained in the carrier retaining portion 5 is transported out of the carrier C by the indexer robot IR. The substrate W transported out of the carrier C is transferred from the indexer robot IR to the center robot CR. The center robot CR loads the untreated substrate W received from the indexer robot IR into one of the silylation/etching units 207a.

Prior to the loading of the substrate W into the silylation/etching unit 207a, the gate opening/closing mechanism 51 is driven by the controller 4. Thus, the gate-shutter 50 is located at the open position to uncover the opening 48 of the chamber 41. Thereafter, the center robot CR loads the substrate W into the chamber 41 to place the substrate W on the spin chuck 38. When the substrate W is placed on the spin chuck 38, the shield plate 252 is located at the retracted position at which the shield plate 252 is significantly retracted above the spin chuck 38.

After the center robot CR places the substrate W on the spin chuck 38, the controller 4 retracts the center robot CR from the chamber 41. Thereafter, the gate opening/closing mechanism 51 is driven by the controller 4 to locate the gate shutter 50 at the closed position. Thus, the opening 48 of the chamber 41 is tightly closed with the gate shutter 50. After the closing of the opening 48 of the chamber 41, the controller 4 controls the spin motor 43 to rotate the substrate W held by the spin chuck 38.

Then, as shown in FIG. 10(a), a silylation process (silylation step) is performed to silylate the substrate W by supplying the silylation agent to the substrate W. More specifically, the controller 4 controls the shield plate lift mechanism 269 to move the shield plate 252 from the retracted position to the adjacent position. Thus, the lower surface of the disk portion 254 of the shield plate 252 is located adjacent an upper surface of the substrate W, while the tubular portion 255 of the shield plate 252 surrounds the substrate W. With the shield plate 252 located at the adjacent position, the controller 4 opens the first gas valve 266 and the second gas valve 267 to spout the nitrogen gas from the center gas outlet port 260 and the annular gas outlet port 262. Thus, the atmosphere (moisture-containing atmosphere) present between the disk portion 254 and the spin base 42 is replaced with a nitrogen gas atmosphere.

In turn, the controller 4 opens the silylation agent valve 265 to spout liquid HMDS as an exemplary silylation agent from the silylation agent outlet port 259 with the shield plate 252 located at the adjacent position. The HMDS spouted from the silylation agent outlet port 259 is supplied to a center portion of the upper surface of the substrate W, and receives a centrifugal force generated by the rotation of the substrate W to spread outward on the upper surface of the substrate W. Thus, the HMDS is supplied to the entire upper surface of the substrate W to silylate the entire upper surface of the substrate W. After a lapse of a predetermined period from the opening of the silylation agent valve 265, the controller 4 closes the silylation agent valve 265 to stop spouting the HMDS from the silylation agent outlet port 259. During the supply of the HMDS to the substrate W, the heater 256 is driven by the controller 4 to heat the substrate W.

After the spouting of the HMDS is stopped, the controller 4 opens the first gas valve 266 and the second gas valve 267 again to spout the nitrogen gas from the center gas outlet port 260 and the annular gas outlet port 262 with the shield plate 252 located at the adjacent position. Thus, the atmosphere present between the disk portion 254 and the spin base 42 is replaced with the nitrogen gas atmosphere. The atmosphere expelled from a space between the disk portion 254 and the spin base 42 by the supply of the nitrogen gas is discharged from the chamber 41 by the evacuation mechanism (not shown).

In this manner, the moisture-containing atmosphere is removed from the periphery of the substrate W prior to the supply of the HMDS to the substrate W. This substantially prevents the HMDS from reacting with water to generate ammonia gas. After the supply of the HMDS to the substrate W, the atmosphere present between the shield plate 252 and the spin base 42 is removed from the chamber 41. Therefore, ammonia gas generated by a reaction between the HMDS and the substrate W is removed from the chamber 41.

Then, as shown in FIG. 10(b), an etching process (etching step) is performed to etch the substrate W by supplying a liquid mixture containing hydrofluoric acid and ethylene glycol as an exemplary etching agent to the substrate W. More specifically, the controller 4 opens the etching agent valve 44 to spout the hydrofluoric acid/ethylene glycol liquid mixture toward the center portion of the upper surface of the substrate W held by the spin chuck 38 from the etching agent nozzle 39, while causing the spin chuck 38 to rotate the substrate W. The hydrofluoric acid/ethylene glycol liquid mixture spouted from the etching agent nozzle 39 is supplied to the center portion of the upper surface of the substrate W, and receives a centrifugal force generated by the rotation of the substrate W to spread outward on the upper surface of the substrate W. Thus, the hydrofluoric acid/ethylene glycol liquid mixture is supplied to the entire upper surface of the substrate W to etch the entire upper surface of the substrate W. After a lapse of a predetermined period from the opening of the etching agent valve 44, the controller 4 closes the etching agent valve 44 to stop spouting the hydrofluoric acid/ethylene glycol liquid mixture from the etching agent nozzle 39.

Subsequently, as shown in FIG. 10(c), a rinsing process (rinsing step) is performed to rinse away the hydrofluoric acid/ethylene glycol liquid mixture adhering to the substrate W by supplying deionized water as an exemplary rinse liquid to the substrate W. More specifically, the controller 4 opens the rinse liquid valve 46 to spout the deionized water toward the center portion of the upper surface of the substrate W held by the spin chuck 38 from the rinse liquid nozzle 40, while causing the spin chuck 38 to rotate the substrate W. The deionized water spouted from the rinse liquid nozzle 40 is supplied to the center portion of the upper surface of the substrate W, and receives a centrifugal force generated by the rotation of the substrate W to spread outward on the upper surface of the substrate W. Thus, the deionized water is supplied to the entire upper surface of the substrate W to rinse away the hydrofluoric acid/ethylene glycol liquid mixture adhering to the substrate W. After a lapse of a predetermined period from the opening of the rinse liquid valve 46, the controller 4 closes the rinse liquid valve 46 to stop spouting the deionized water from the rinse liquid nozzle 40.

Then, as shown in FIG. 10(d), a drying (spin dry) process (drying step) is performed to dry the substrate W. More specifically, the controller 4 controls the spin motor 43 to rotate the substrate W at a higher rotation speed (e.g., several thousands rpm). Thus, a greater centrifugal force acts on the deionized water adhering to the substrate W to spin off the deionized water around the substrate W. Thus, the deionized water is removed from the substrate W to dry the substrate W. After the drying process is performed for a predetermined period, the controller 4 controls the spin motor 43 to cause the spin chuck 38 to stop rotating the substrate W. Thereafter, the gate opening/closing mechanism 51 is driven by the controller 4 to locate the gate shutter 50 at the open position. Thus, the opening 48 of the chamber 41 is uncovered.

After the opening 48 of the chamber 41 is uncovered, the substrate W held by the spin chuck 38 is unloaded from the silylation/etching unit 207a by the center robot CR. The substrate W unloaded from the silylation/etching unit 207a is transferred from the center robot CR to the indexer robot IR. The indexer robot IR transports the treated substrate W received from the center robot CR into the carrier C retained in the carrier retaining portion 5. Thus, the substrate treatment apparatus 201 completes the process sequence. The controller 4 repeatedly performs this process sequence to treat a plurality of substrates W one by one.

In the second embodiment, as described above, the silylation agent and then the etching agent are supplied to the substrate W held on the spin chuck 38. In the second embodiment, more specifically, the silylation position and the etching position are located at the same position, so that the supply of the silylation agent to the substrate W and then the supply of the etching agent to the substrate W are effected with the substrate W located at the same position. Therefore, there is no need to move the substrate W to the etching position after the supply of the silylation agent to the substrate W. This reduces the substrate transport period, thereby reducing the substrate treatment period.

Third Embodiment

Figure 11:
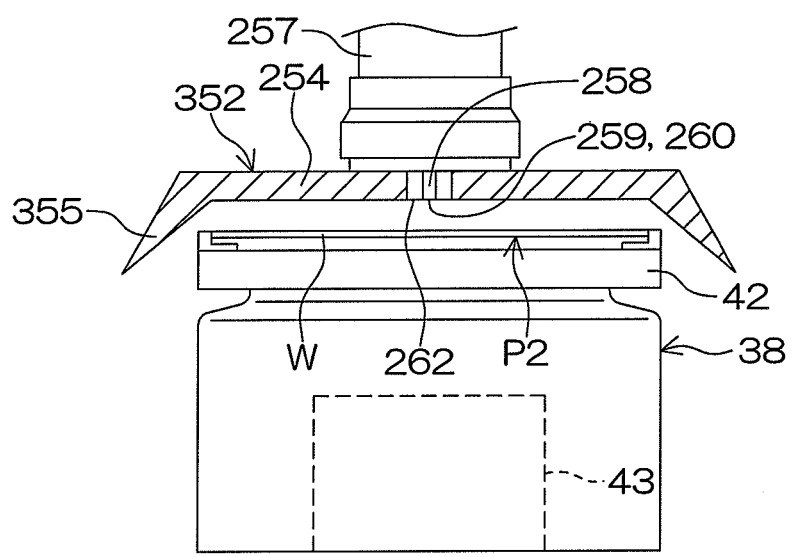
FIG. 11 is a sectional view of a shield plate according to a third embodiment of the present invention.

In the second embodiment, the tubular portion 255 of the shield plate 252 has a hollow cylindrical shape, but may have a truncated cone shape. More specifically, as shown in FIG. 11, a shield plate 352 according to a third embodiment may include a tubular portion 355 provided along an outer periphery of a disk portion 254 as flared downward outward from the outer periphery of the disk portion 254. Further, the tubular portion 355 may have a wall thickness that is progressively reduced toward a lower edge of the tubular portion 355.

Fourth Embodiment

Next, a fourth embodiment of the present invention will be described. A major difference between the fourth embodiment and the first embodiment is that the substrate W is etched by an etching agent vapor. In FIGS. 12 to 18, components equivalent to those shown in FIGS. 1 to 11 are designated by the same reference characters as in FIGS. 1 to 11, and duplicate description will be omitted.

Figure 12:
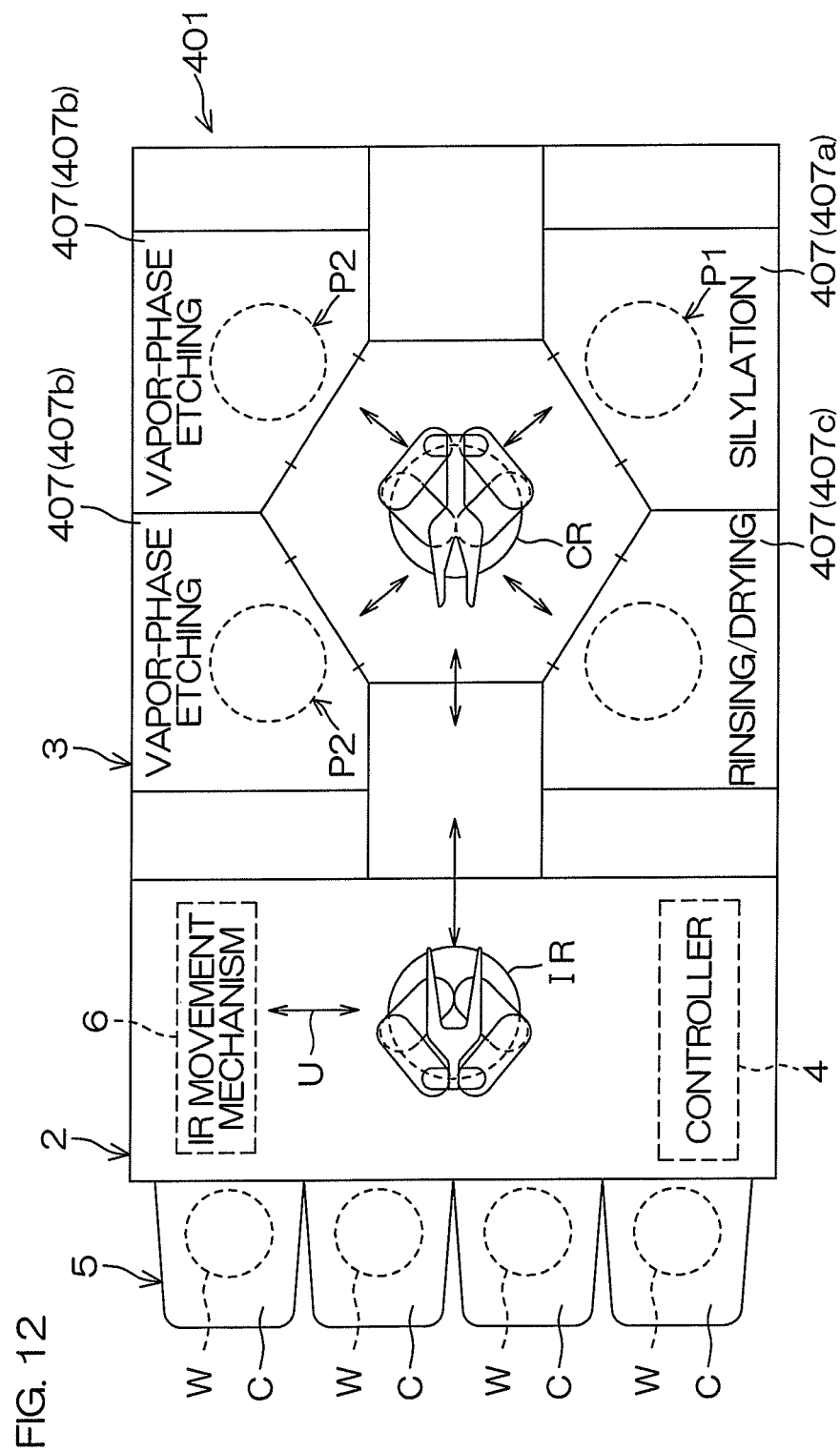
FIG. 12 is a schematic plan view showing a layout in a substrate treatment apparatus according to a fourth embodiment of the present invention.

FIG. 12 is a schematic plan view showing a layout in a substrate treatment apparatus 401 according to the fourth embodiment of the present invention.

The substrate treatment apparatus 401 includes a plurality of treatment units 407 each adapted to treat a substrate W. These treatment units 407 are disposed around a center robot CR as seen in plan. The center robot CR transports a substrate W between an indexer robot IR and the treatment units 407 and between the treatment units 407. The treatment units 407 include a silylation unit 407a adapted to silylate a substrate W, etching units 407b each adapted to etch a substrate W, and a cleaning unit 407c adapted to supply a rinse liquid to a substrate W and dry the substrate W.

Though not shown, the cleaning unit 407c includes a spin chuck 38, a rinse liquid nozzle 40 (rinse liquid supply unit) and a chamber 41 (see FIG. 3). In the cleaning unit 407c, deionized water spouted from the rinse liquid nozzle 40 is supplied to the entire upper surface of a substrate W held by the spin chuck 38 to rinse away liquid and foreign matter adhering to the substrate W (rinsing process, rinsing step). Thereafter, the spin chuck 38 rotates the substrate W at a higher rotation speed to remove the deionized water from the substrate W. In this manner, the substrate W is dried (drying process, drying step).

Figure 13:
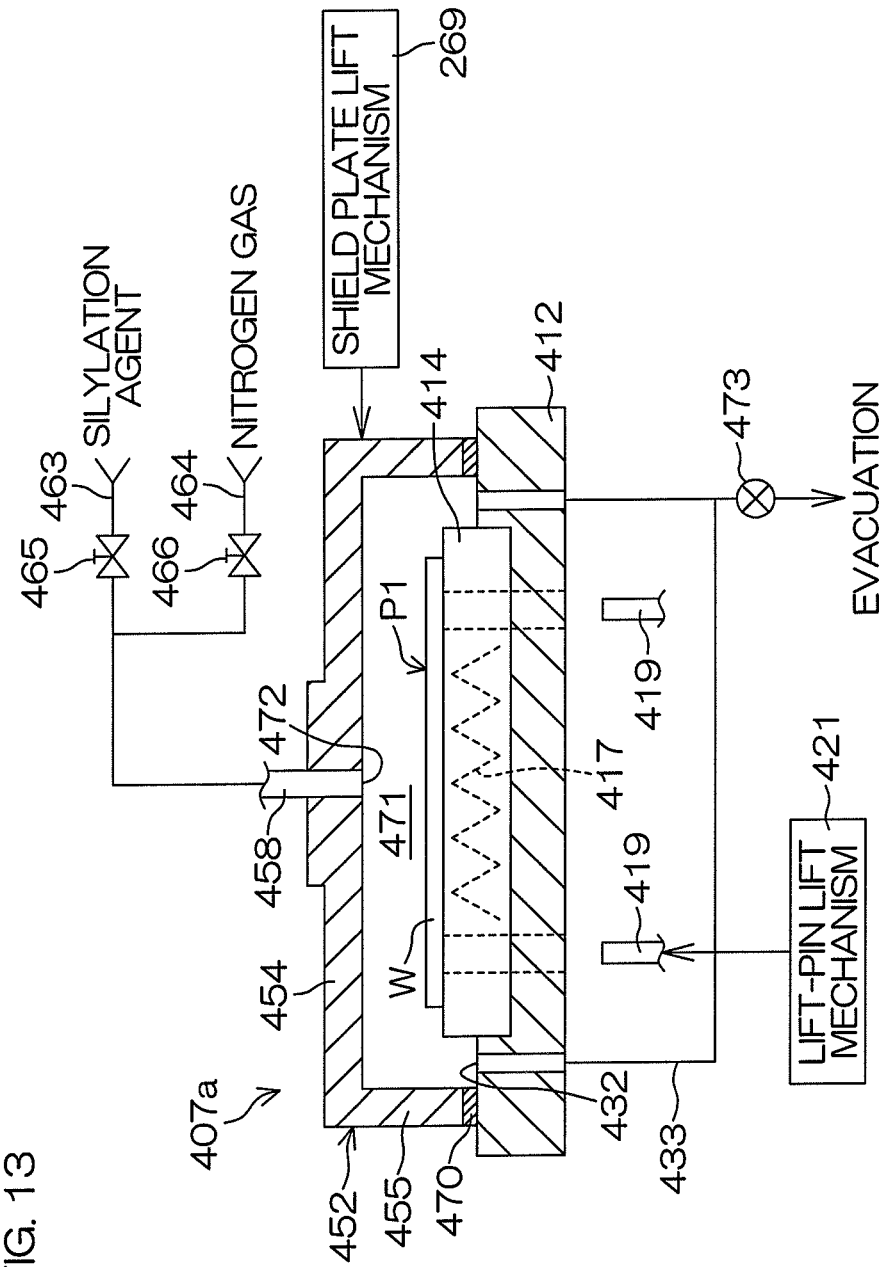
FIG. 13 is a schematic diagram schematically showing the construction of a silylation unit according to the fourth embodiment of the present invention.
Figure 14:
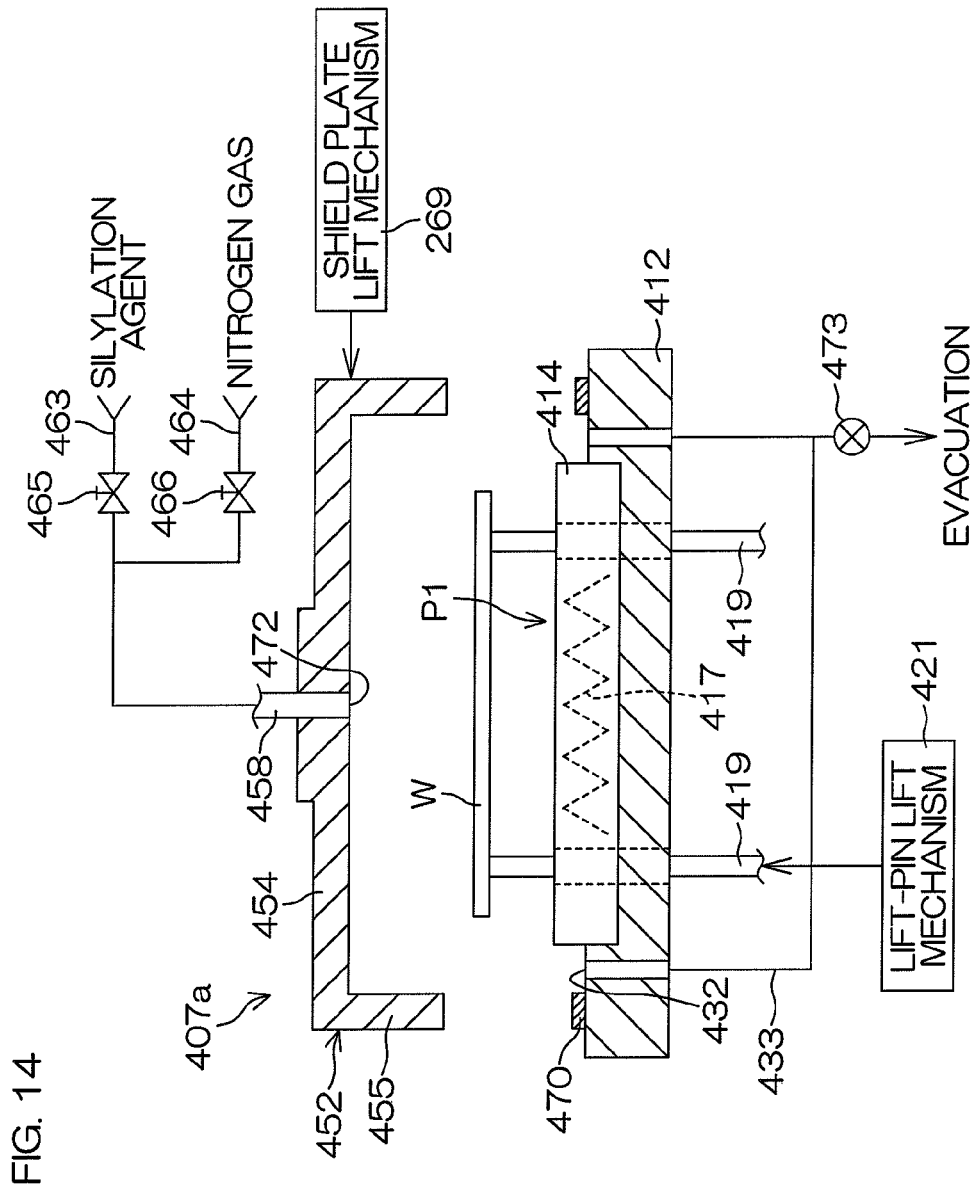
FIG. 14 is a schematic diagram schematically showing the construction of the silylation unit according to the fourth embodiment of the present invention.

FIGS. 13 and 14 are schematic diagrams schematically showing the construction of the silylation unit 407a according to the fourth embodiment of the present invention. The schematic construction of the silylation unit 407a and an exemplary substrate treatment to be performed in the silylation unit 407a will be described. First, the schematic construction of the silylation unit 407a will be described.

The silylation unit 407a includes a substrate holding base 414 which holds a substrate W, a heater 417 which heats the substrate W held by the substrate holding base 414, and a support member 412 which supports the substrate holding base 414. The substrate holding base 414 is, for example, a disk-shaped plate having a greater diameter than the substrate W. The heater 417 is embedded in the substrate holding base 414. The substrate W is horizontally placed on the substrate holding base 414 with the center of the substrate W and the center of the substrate holding base 414 in alignment with a common vertical axis. Thus, the substrate W is horizontally held at a holding position P1 by the substrate holding base 414. In the fourth embodiment, a substrate holding unit is defined by the substrate holding base 414 and a hot plate 478 to be described later. The substrate holding base 414 is disposed on the support member 412. The support member 412 is, for example, a disk-shaped plate having a greater diameter than the substrate holding base 414. The support member 412 has an outer peripheral portion which projects outward of the substrate holding base 414.

The silylation unit 407a further includes a plurality of lift pins 419 which support the substrate W above the substrate holding base 414, and a lift-pin lift mechanism 421 which moves up and down the lift pins 419 together. The lift pins 419 each extend vertically. Upper ends of the respective lift pins 419 are located at the same height level. The substrate holding base 414 and the support member 412 each have a plurality of through-holes vertically extending therethrough. When the lift-pin lift mechanism 421 moves up the lift pins 419 from a retracted position (a position shown in FIG. 13) to a projecting position (a position shown in FIG. 14), the lift pins 419 are respectively inserted through the through-holes of the support member 412 and then through the through-holes of the substrate holding base 414 so that the upper ends of the lift pins 419 project above an upper surface of the substrate holding base 414. When the lift-pin lift mechanism 421 moves down the lift pins 419 from the projecting position to the retracted position, on the other hand, the upper ends of the respective lift pins 419 are moved down to a lower side of the upper surface of the substrate holding base 414.

The lift pins 419 support a lower surface of the substrate W to horizontally hold the substrate W. When the lift pins 419 holding the substrate W at the projecting position are moved down to the retracted position by the lift-pin lift mechanism 421, the substrate W held by the lift pins 419 is placed on the substrate holding base 414. Thus, the substrate W is transported to the holding position P1, and horizontally held at the holding position P1 by the substrate holding base 414. When the lift pins 419 are moved up from the retracted position to the projecting position by the lift-pin lift mechanism 421 with the substrate W held by the substrate holding base 414, on the other hand, the substrate W held by the substrate holding base 414 is supported by the lift pins 419 and transported to a higher level than the holding position P1. Thus, the substrate W is transferred between the substrate holding base 414 and the lift pins 419.

The silylation unit 407a further includes a shield plate 452 disposed above the support member 412. The shield plate 452 includes a disk portion 454 horizontally disposed, and a tubular portion 455 provided along an outer periphery of the disk portion 454. The tubular portion 455 extends vertically downward from the outer periphery of the disk portion 454. The tubular portion 455 has a hollow cylindrical shape. The disk portion 454 and the tubular portion 455 are coaxial with each other. The disk portion 454 has a greater diameter than the substrate holding base 414. The tubular portion 455 has a inner diameter that is greater than the diameter of the substrate holding base 414. The inner diameter of the tubular portion 455 is smaller than the outer diameter of the support member 412. The shield plate 452 is disposed with a lower surface of the disk portion 454 thereof kept horizontal. With the substrate W held by the substrate holding base 414, the lower surface of the disk portion 454 is opposed to the upper surface of the substrate W. The shield plate 452 is disposed with the center of the disk portion 454 and the center of the substrate holding base 414 in alignment with a common vertical axis.

The tubular portion 455 has a lower edge which is opposed to a peripheral portion of an upper surface of the support member 412. An annular seal member 470 (e.g., O-ring) having an inner diameter greater than the diameter of the substrate holding base 414 is disposed between the lower edge of the tubular member 455 and the upper surface peripheral portion of the support member 412. In the fourth embodiment, the seal member 470 is retained on the upper surface peripheral portion of the support member 412. The seal member 470 may be retained on the lower edge of the tubular portion 455 rather than on the support member 412. The seal member 470 extends circumferentially of the support member 412 along the upper surface peripheral portion of the support member 412. The shield plate 452 is connected to the shield plate lift mechanism 269. The shield plate lift mechanism 269 moves up and down the shield plate 452 between a sealed position (a position shown in FIG. 13) and an open position located above the sealed position (a position shown in FIG. 14). The shield plate lift mechanism 269 moves down the shield plate 452 from the open position to the sealed position, whereby a gap defined between the lower edge of the tubular portion 455 and the upper surface of the support member 412 is sealed with the seal member 470. Thus, an accommodation space 471 (see FIG. 13) including the holding position P1 is sealed. On the other hand, the shield plate lift mechanism 269 moves the shield plate 452 from the sealed position to the open position, whereby the tubular portion 455 is separated from the seal member 470 to open the accommodation space 471.

The disk portion 454 has an outlet port 472 provided in a center portion of the lower surface thereof. A silylation agent inlet pipe 458 (silylation agent supply unit) is connected to the outlet port 472. A silylation agent vapor is supplied to the silylation agent inlet pipe 458 through a silylation agent supply pipe 463. Further, nitrogen gas is supplied to the silylation agent inlet pipe 458 through a nitrogen gas supply pipe 464. A silylation agent valve 465 which controls the on and off of the supply of the silylation agent to the silylation agent inlet pipe 458 is provided in the silylation agent supply pipe 463. A nitrogen gas valve 466 which controls the on and off of the supply of the nitrogen gas to the silylation agent inlet pipe 458 is provided in the nitrogen gas supply pipe 464. The silylation agent vapor and the nitrogen gas supplied to the silylation agent inlet pipe 458 is spouted downward from the outlet port 472.

An annular gas outlet 432 surrounding the substrate holding base 414 as seen in plan is provided in the upper surface of the support member 412. The gas outlet 432 communicates with the accommodation space 471. A gas outlet pipe 433 is connected to the gas outlet 432 at one end thereof. A pressure regulation valve 473 is provided in the gas outlet pipe 433. With the shield plate 452 located at the sealed position, the accommodation space 471 is sealed. Therefore, if the silylation agent vapor or the nitrogen gas is spouted from the outlet port 472 in this state, the internal pressure of the accommodation space 471 is increased. When the internal pressure of the accommodation space 471 reaches a predetermined level, the pressure regulation valve 473 is opened to evacuate the accommodation space 471 through the gas outlet 432. Thus, the internal pressure of the accommodation space 471 is reduced. When the internal pressure of the accommodation space 471 becomes lower than the predetermined level, the pressure regulation valve 473 is closed. Therefore, the accommodation space 471 is purged by spouting the silylation agent vapor or the nitrogen gas from the outlet port 472 with the shield plate 452 located at the sealed position. Thus, the atmosphere in the accommodation space 471 is replaced with the silylation agent vapor or the nitrogen gas. When the spouting of the silylation agent vapor or the nitrogen gas from the outlet port 472 is thereafter stopped, the pressure regulation valve 473 is closed. Thus, the accommodation space 471 is constantly filled with the silylation agent vapor or the nitrogen gas.

Next, an exemplary substrate treatment to be performed in the silylation unit 407a will be described.

When a substrate W is loaded into the silylation unit 407a, the shield plate 452 is preliminarily located at the open position, and the lift pins 419 are located at the projecting position. In this state, the controller 4 causes the center robot CR to place the substrate W on the lift pins 419. The controller 4 retracts the center robot CR, and then causes the lift-pin lift mechanism 421 to move down the lift pins 419 to the retracted position. Thus, the substrate W supported by the lift pins 419 is placed on the substrate holding base 414, and held at the holding position P1 by the substrate holding base 414. After the lift pins 419 are moved to the retracted position, the controller 4 causes the shield plate lift mechanism 269 to move down the shield plate 452 to the sealed position. Thus, the accommodation space 471 is sealed. Therefore, the substrate W is retained in the sealed space.

In turn, the atmosphere in the accommodation space 471 is replaced with the nitrogen gas atmosphere. More specifically, the controller 4 opens the nitrogen gas valve 466 to spout the nitrogen gas from the outlet port 472 with the shield plate 452 located at the sealed position. Thus, the nitrogen gas is supplied into the accommodation space 471. Therefore, the internal pressure of the accommodation space 471 is increased, so that the pressure regulation valve 473 is opened. Therefore, the accommodation space 471 is evacuated through the gas outlet 432. Thus, the atmosphere in the accommodation space 471 is replaced with the nitrogen gas. Thereafter, the controller 4 closes the nitrogen gas valve 466, whereby the pressure regulation valve 473 is closed to stop the evacuation of the accommodation space 471. Therefore, the accommodation space 471 is constantly filled with the nitrogen gas.

Subsequently, an HMDS vapor is supplied as an exemplary silylation agent to the substrate W. More specifically, the controller 4 opens the silylation agent valve 465 to spout the HMDS vapor from the outlet port 472 with the shield plate 452 located at the sealed position. Thus, the HMDS vapor is supplied into the accommodation space 471. Therefore, the pressure regulation valve 473 is opened to evacuate the accommodation space 471, whereby the nitrogen gas filled in the accommodation space 471 is replaced with the HMDS vapor. Thereafter, the controller 4 closes the silylation agent valve 465. Thus, the pressure regulation valve 473 is closed to stop the evacuation of the accommodation space 471. Therefore, the accommodation space 471 is constantly filled with the HMDS vapor. With the accommodation space 471 filled with the HMDS vapor, the HMDS vapor is supplied to the substrate W held at the holding position P1 on the substrate holding base 414. Further, the substrate W held on the substrate holding base 414 is kept at a predetermined temperature (e.g., a predetermined temperature in the range of 50° C. to 100° C.) higher than the room temperature by heating with the heater 417. Therefore, the HMDS vapor is supplied to the substrate W kept at the predetermined temperature. In this manner, the silylation process (silylation step) is performed to silylate the entire upper surface of the substrate W.

Then, the atmosphere in the accommodation space 471 is replaced with a nitrogen gas atmosphere. More specifically, the controller 4 opens the nitrogen gas valve 466 to spout the nitrogen gas from the outlet port 472 with the shield plate 452 located at the sealed position. Thus, the nitrogen gas is supplied to the accommodation space 471. Therefore, the pressure regulation valve 473 is opened to evacuate the accommodation space 471, whereby the HMDS vapor filled in the accommodation space 471 and gas generated by a reaction between the substrate W and the HMDS are replaced with the nitrogen gas. After the atmosphere in the accommodation space 471 is replaced with the nitrogen gas, the controller 4 closes the nitrogen gas valve 466. Thus, the pressure regulation valve 473 is closed to stop the evacuation of the accommodation space 471. Therefore, the accommodation space 471 is constantly filled with the nitrogen gas.

In turn, the substrate W is unloaded from the silylation unit 407a. More specifically, the controller 4 causes the shield plate lift mechanism 269 to move up the shield plate 452 to the open position. Thereafter, the controller 4 causes the lift-pin lift mechanism 421 to move up the lift pins 419 to the projecting position. Thus, the substrate W held on the substrate holding base 414 is supported by the lift pins 419 to be located above the holding position P1. After the lift pins 419 are moved to the projecting position, the controller 4 causes the center robot CR to unload the substrate W supported by the lift pins 419. Thus, the substrate W is transported out of the silylation unit 407a.

Figure 15:
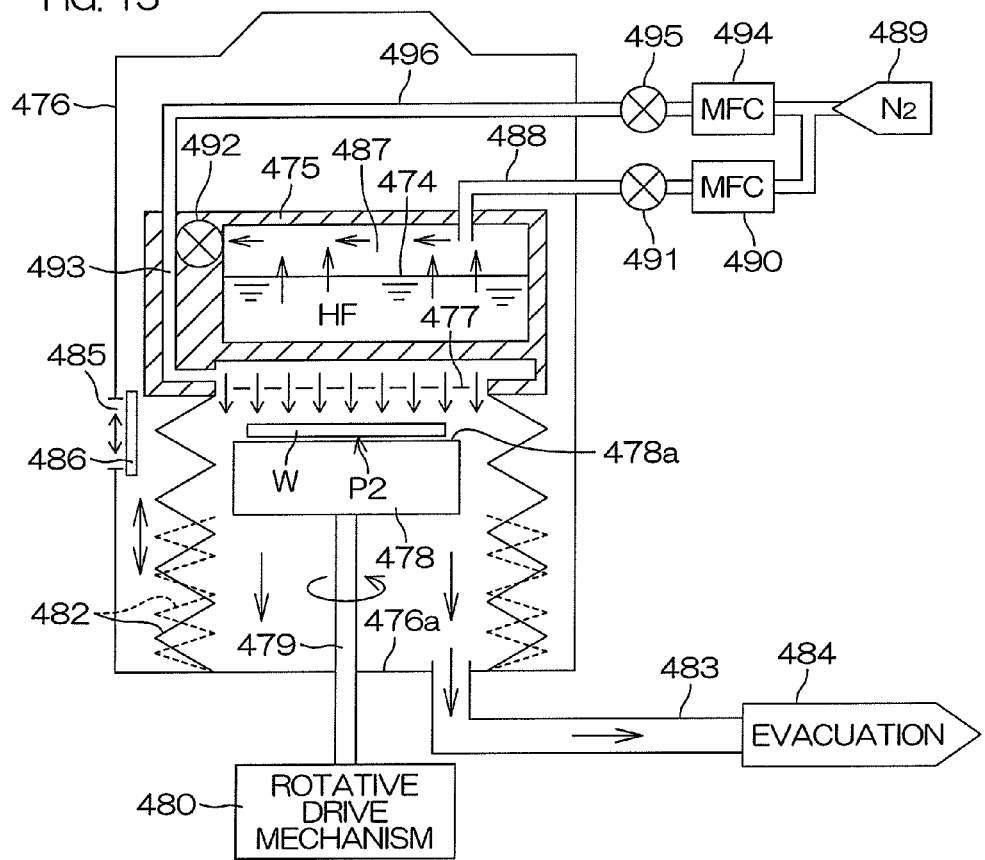
FIG. 15 is a schematic diagram schematically showing the construction of an etching unit according to the fourth embodiment of the present invention.

FIG. 15 is a schematic diagram schematically showing the construction of each of the etching units 407b according to the fourth embodiment of the present invention. The schematic construction of the etching unit 407b and an exemplary substrate treatment to be performed in the etching unit 407b will be described. First, the schematic construction of the etching unit 407b will be described.

The etching unit 407b includes a vapor generating container 475 (etching agent supply unit) in which a hydrofluoric acid aqueous solution 474 is stored in a sealed state, and a housing 476 which accommodates the vapor generating container 475. A punch plate 477 having a multiplicity of through-holes through which a hydrofluoric acid vapor is spouted downward as an exemplary etching agent is disposed below the vapor generating container 475. A hot plate 478 which horizontally holds the substrate W at a holding position P2 in opposed relation to the punch plate 477 is disposed below the punch plate 477. The hot plate 478 is fixed to an upper end of a rotation shaft 479. When a rotative driving mechanism 480 including a motor and the like rotates the rotation shaft 479, the hot plate 478 is rotated together with the rotation shaft 479 about a vertical axis. The substrate W held by the hot plate 478 is heated by the hot plate 478.

The etching unit 407b further includes a tubular bellows 482 provided around the hot plate 478. The hot plate 478 is disposed within the bellows 482. The bellows 482 is vertically contractible with respect to a bottom surface 476a of the housing 476. The bellows 482 is elongated and contracted between a sealed position (indicated by a solid line) at which an upper edge of the bellows 482 abuts against the punch plate 477 to seal a space around the hot plate 478 and a retracted position (indicated by a broken line) at which the upper edge of the bellows 482 is retracted below an upper surface 478a of the hot plate 478 by a drive mechanism not shown. The inside of the bellows 482 is evacuated through a gas outlet pipe 483 connected to the bottom surface 476a of the housing 476 by an evacuation mechanism 484.

The housing 476 has an opening 485 provided in a side wall thereof on a lateral side of the hot plate 478. The opening 485 is covered and uncovered with a shutter 486. When the substrate W is loaded into the etching unit 407b, the bellows 482 is preliminarily located at the retracted position (indicated by the broken line), and the opening 485 is uncovered. In this state, the substrate W is placed on the hot plate 478 by the center robot CR. Thereafter, the opening 485 is covered with the shutter 486. When the substrate W is unloaded from the etching unit 407b, on the other hand, the bellows 482 is located at the retracted position, and the opening 485 is uncovered. In this state, the substrate W held by the hot plate 478 is unloaded by the center robot CR. Thereafter, the opening 485 is covered with the shutter 486.

A nitrogen gas supply pipe 488 through which nitrogen gas is supplied as a carrier gas into a vapor filled space 487 defined in the vapor generating container 475 is connected to the vapor generating container 475. Nitrogen gas from a nitrogen gas supply source 489 is supplied into the vapor filled space 487 through a flow rate controller (MFC) 490, a valve 491 and a nitrogen gas supply pipe 488. The vapor filled space 487 is connected to a vapor supply passage 493 via a valve 492. The nitrogen gas from the nitrogen gas supply source 489 is also supplied to the vapor supply passage 493 through a flow rate controller 494, a valve 495 and a nitrogen gas supply pipe 496. With the valve 492 being open, the hydrofluoric acid vapor present in the vapor filled space 487 is supplied to the vapor supply passage 493 through the valve 492 by the flow of the nitrogen gas. Then, the hydrofluoric acid vapor supplied to the vapor supply passage 493 is further supplied to the punch plate 477 through the vapor supply passage 493 by the flow of the nitrogen gas.

The hydrofluoric acid aqueous solution 474 to be stored in the vapor generating container 475 is prepared so as to have a concentration (e.g., about 39.6% at 1 atom at the room temperature) which provides a pseudo-azeotropic composition. The hydrofluoric acid aqueous solution 474 of the pseudo-azeotropic composition is such that water and hydrogen fluoride are evaporated at the same evaporation rate from the hydrofluoric acid aqueous solution. Even if the amount of the hydrofluoric acid aqueous solution 474 in the vapor generating container 475 is reduced by supplying the hydrofluoric acid vapor to the vapor supply passage 493 from the vapor filled space 487 through the valve 492, therefore, the concentration of the hydrofluoric acid vapor supplied to the vapor supply passage 493 is kept at a constant level.

Next, an exemplary substrate treatment to be performed in the etching unit 407b will be described.

When the front surface of the substrate W is etched, the substrate W is held by the hot plate 478, and the controller 4 opens the three valves 491, 492, 495 with the bellows 482 located at the sealed position (indicated by the solid line). Thus, the hydrofluoric acid vapor generated in the vapor generating container 475 is expelled into the vapor supply passage 493 via the valve 492 by the nitrogen gas supplied from the nitrogen gas supply pipe 488. Further, the hydrofluoric acid vapor is carried to the punch plate 477 by the nitrogen gas supplied from the nitrogen gas supply pipe 496. Then, the hydrofluoric acid vapor is supplied to the upper surface (front surface) of the substrate W held by the hot plate 478 through the through-holes provided in the punch plate 477. While the hydrofluoric acid vapor is supplied to the substrate W, the controller 4 causes the rotative drive mechanism 480 to rotate the substrate W about the vertical axis at a constant rotation speed. Further, the controller 4 causes the hot plate 478 to heat the substrate W to keep the temperature of the substrate W, for example, at a predetermined temperature in the range of 40° C. to 150° C. Thus, the hydrofluoric acid vapor is supplied to the entire front surface of the substrate W kept at the constant temperature, whereby the front surface of the substrate W is etched (etching process, etching step).

FIG. 16 is a diagram for explaining exemplary substrate treatments to be performed by the substrate treatment apparatus 401 according to the fourth embodiment of the present invention. In the following description, a silylation process, an etching process and a rinsing process are performed by the silylation unit 407a, the etching unit 407b and the cleaning unit 407c, respectively. Exemplary selective etching processes will hereinafter be described, which are each performed on a substrate W having an $SiO_2$ film and an SiN film respectively formed as an exemplary oxide film and an exemplary nitride film on a front surface thereof for selectively removing the SiN film by supplying the hydrofluoric acid vapor as an exemplary etching agent to the front surface of the substrate W.

In Exemplary Process 4-1, the controller 4 causes the indexer robot IR and the center robot CR to transport the substrate W from one of the carriers C to the silylation unit 407a. Thereafter, the controller 4 performs the silylation process in the silylation unit 407a. Thus, the entire upper surface of the substrate W is silylated. Then, the controller 4 causes the center robot CR to transport the substrate W from the silylation unit 407a to one of the etching units 407b. Thereafter, the controller 4 performs the etching process in the etching unit 407b. Thus, the entire upper surface of the substrate W is etched. Then, the controller 4 causes the indexer robot IR and the center robot CR to transport the substrate W into the carrier C.

In Exemplary Process 4-2, the controller 4 causes the indexer robot IR and the center robot CR to transport the substrate W from one of the carriers C to the silylation unit 407a and then to one of the etching units 407b. In the silylation unit 407a and the etching unit 407b, the controller 4 successively performs the silylation process and the etching process. After the etching process, the controller 4 causes the center robot CR to transport the substrate W from the etching unit 407b to the cleaning unit 407c. Thereafter, the controller 4 performs the rinsing process and the drying process in the cleaning unit 407c. Thus, liquid and foreign matter adhering to the substrate W is rinsed away. Then, the controller 4 causes the indexer robot IR and the center robot CR to transport the substrate W into the carrier C.

In Exemplary Process 4-3, the controller 4 causes the indexer robot IR and the center robot CR to transport the substrate W from one of the carriers C to the silylation unit 407a and then to one of the etching units 407b. In the silylation unit 407a and the etching unit 407b, the controller 4 successively performs the silylation process and the etching process. After the etching process, the controller 4 successively performs the silylation process and the etching process again. That is, the controller 4 performs a repeating step to perform a sequence cycle including the silylation process and the etching process a plurality of times in Exemplary Process 4-3. After the repeating step, the controller 4 causes the center robot CR to transport the substrate W from the etching unit 407b to the cleaning unit 407c. Thereafter, the controller 4 performs the rinsing process and the drying process in the cleaning unit 407c. Then, the controller 4 causes the indexer robot IR and the center robot CR to transport the substrate W into the carrier C.

In Exemplary Process 4-4, the controller 4 causes the indexer robot IR and the center robot CR to transport the substrate W from one of the carriers C to the silylation unit 407a, then to one of the etching units 407b and to the cleaning unit 407c. In the silylation unit 407a, the etching unit 407b and the cleaning unit 407c, the controller 4 successively performs the silylation process, the etching process, the rinsing process and the drying process. After the drying process, the controller 4 successively performs the silylation process, the etching process, the rinsing process and the drying process again. That is, the controller 4 performs a repeating step to perform a sequence cycle including the silylation process, the etching process, the rinsing process and the drying process a plurality of times in Exemplary Process 4-4. After the repeating step, the controller 4 causes the indexer robot IR and the center robot CR to transport the substrate W into the carrier C.

Figure 17:
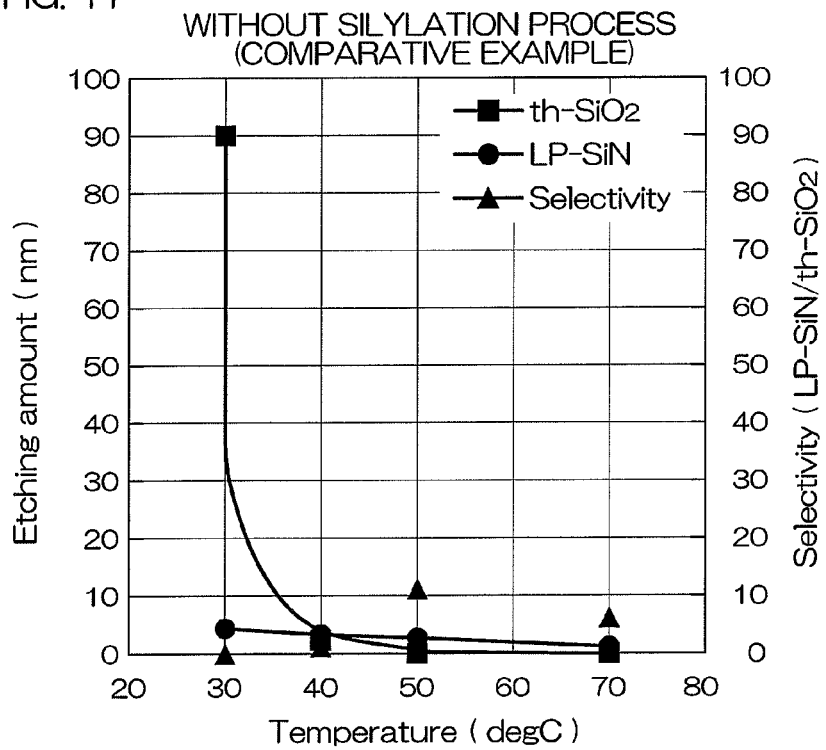
FIG. 17 is a graph showing a relationship between a substrate temperature, an etching amount and a selectivity observed when a substrate not subjected to the silylation was etched.
Figure 18:
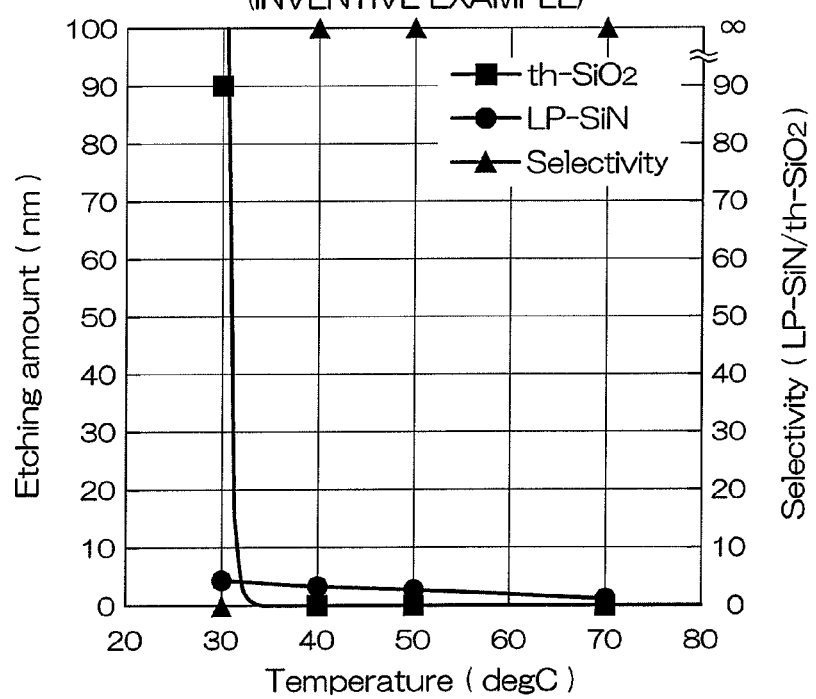
FIG. 18 is a graph showing a relationship between the substrate temperature, the etching amount and the selectivity observed when a substrate subjected to the silylation was etched.

FIG. 17 is a graph showing a relationship between a substrate temperature, an etching amount and a selectivity observed when a substrate W not subjected to the silylation was etched. FIG. 18 is a graph showing a relationship between the substrate temperature, the etching amount and the selectivity observed when a substrate W subjected to the silylation was etched. The graph of FIG. 17 relates to a comparative example, while the graph of FIG. 18 relates to an inventive example.

The etching amount and the selectivity shown in each of FIGS. 17 and 18 were observed when a front surface of the substrate W formed with an $SiO_2$ film and an SiN film was etched by supplying the hydrofluoric acid vapor to the front surface of the substrate W. The concentration of the hydrofluoric acid vapor used for the etching was 39.6%. The substrate temperature shown in each of the graphs is the temperature of the substrate W observed when the hydrofluoric acid vapor was supplied to the substrate W.

As shown in FIG. 17, when the substrate W not subjected to the silylation was etched at a substrate temperature of 30° C., the $SiO_2$ etching amount (90.00 nm, see a curve plotted with a symbol ■) was significantly greater than the SiN etching amount (4.66 nm, see a curve plotted with a symbol ●). That is, the selectivity was smaller (0.05, see a curve plotted with a symbol ▲) at a substrate temperature of 30° C., because the denominator of the ratio (nitride removal amount/oxide removal amount) representing the selectivity is significantly greater than the numerator of the ratio. Where the temperature of the substrate W was kept at 40° C., 50° C. and 70° C., the SiN etching amount was 3.97 nm (40° C.), 3.39 nm (50° C.) and 1.68 nm (70° C.), respectively, which do not significantly differ from that observed at 30° C. Where the temperature of the substrate W was kept at 40° C., 50° C. and 70° C., the $SiO_2$ etching amount was 2.09 nm (40° C.), 0.31 nm (50° C.) and 0.27 nm (70° C.), respectively. Therefore, the $SiO_2$ film was etched, but its etching amount was smaller than that observed at 30° C. Where the temperature of the substrate W was kept at 40° C., 50° C. and 70° C., the selectivity was 1.90 (40° C.), 11.09 (50° C.) and 6.31 (70° C.), respectively. Where the substrate W not subjected to the silylation was etched with the hydrofluoric acid vapor, therefore, the selectivity was not greater than about 11 irrespective of the temperature of the substrate W.

On the other hand, as shown in FIG. 18, when the substrate W subjected to the silylation was etched at a substrate temperature of 30° C., the $SiO_2$ etching amount (89.00 nm, see a curve plotted with a symbol ■) was significantly greater than the SiN etching amount (4.65 nm, see a curve plotted with a symbol ●). Therefore, the selectivity was smaller (0.05, see a curve plotted with a symbol ▲). Where the temperature of the substrate W was kept at 40° C., 50° C. and 70° C., the SiN etching amount was 3.92 nm (40° C.), 3.48 nm (50° C.) and 1.38 nm (70° C.), respectively, which do not significantly differ from that observed at 30° C. and do not significantly differ from those observed when the substrate W not subjected to the silylation was etched. Where the temperature of the substrate W was kept at 40° C., 50° C. and 70° C., the $SiO_2$ etching amount was −0.05 nm (40° C.), −0.06 nm (50° C.) and −0.07 nm (70° C.), respectively. An etching amount with a minus sign means that the film thickness was increased and the substrate was not etched at all, i.e., the etching amount was zero. At a substrate temperature of 40° C. or higher, the selectivity is infinite because the denominator of the ratio representing the selectivity was zero. Thus, the selectivity at a substrate temperature of 40° C. or higher can be significantly improved by the silylation of the substrate W preceding the etching of the substrate W.

In the fourth embodiment, as described above, the silylated substrate W is etched. Thereafter, the etched substrate W is silylated again, and then the silylated substrate W is etched again. In other words, the etching is interrupted, and the substrate W is silylated again during the etching interruption period. If the supply of the etching agent is continued for a longer period of time, the oxide etching suppression effect of the silylation agent is liable to decrease during the etching, making it impossible to sufficiently suppress the etching of the oxide film. Therefore, the oxide etching suppression effect is recovered by the re-silylation of the substrate W. This suppresses the etching of the oxide film when the etching is resumed, thereby substantially preventing the reduction in selectivity.

In the fourth embodiment, after the silylated substrate W is etched, the rinse liquid is supplied to the substrate W to rinse away liquid and foreign matter adhering to the substrate W. Then, the silylation step, the etching step and the rinsing step are successively performed again. Foreign matter resulting from the etching often adheres to the etched substrate W. If the substrate W suffering from the adhesion of the foreign matter resulting from the etching is silylated, it is often difficult to remove the foreign matter from the substrate W. Therefore, the foreign matter adhering to the substrate W is removed before the re-silylation, whereby persistent adhesion of the foreign matter to the substrate W can be substantially prevented. This substantially prevents the foreign matter from remaining on the substrate W, thereby improving the cleanliness of the substrate W.

Fifth Embodiment

Figure 19:
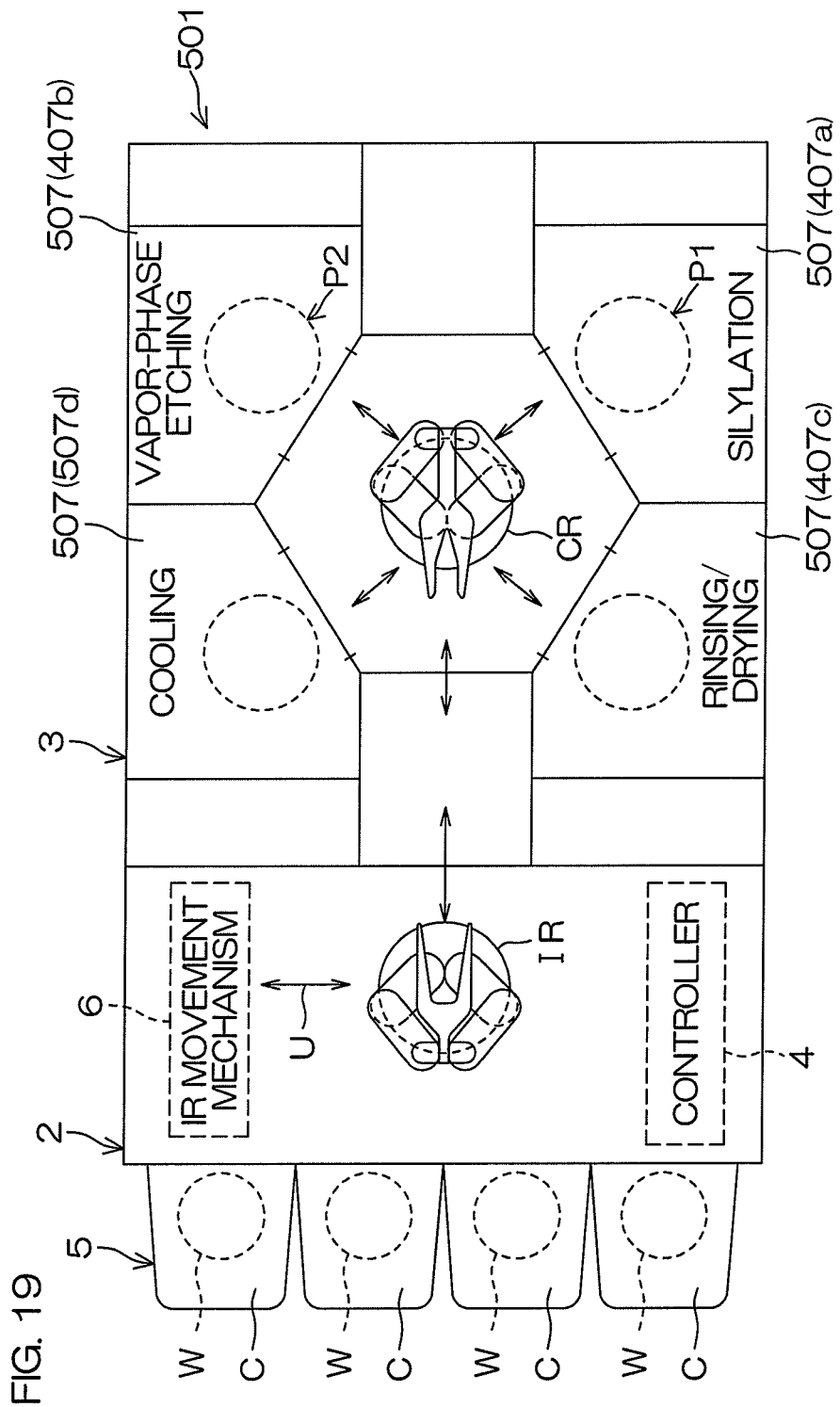
FIG. 19 is a schematic plan view showing a layout in a substrate treatment apparatus according to a fifth embodiment of the present invention.
Figure 20:
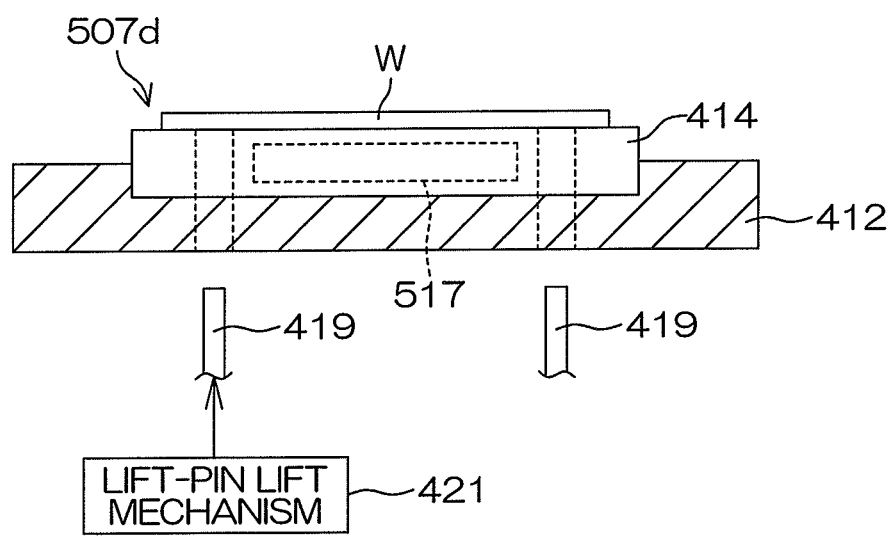
FIG. 20 is a schematic diagram schematically showing the construction of a cooling unit according to the fifth embodiment of the present invention.

Next, a fifth embodiment of the present invention will be described. A major difference between the fifth embodiment and the fourth embodiment is that the treatment units include a cooling unit which cools a substrate W. In FIGS. 19 to 21, components equivalent to those shown in FIGS. 1 to 18 are designated by the same reference characters as in FIGS. 1 to 18, and duplicate description will be omitted.

FIG. 19 is a schematic plan view showing a layout in a substrate treatment apparatus 501 according to the fifth embodiment of the present invention.

The substrate treatment apparatus 501 includes a plurality of treatment units 507 each adapted to treat a substrate W. These treatment units 507 are disposed around a center robot CR as seen in plan. The center robot CR transports a substrate W between an indexer robot IR and the treatment units 507 and between the treatment units 507. The treatment units 507 include a silylation unit 407a, an etching unit 407b, and a cleaning unit 407c. The treatment units 507 further include a cooling unit 507d which cools a substrate W.

FIG. 20 is a schematic diagram schematically showing the construction of the cooling unit 507d according to the fifth embodiment of the present invention.

The cooling unit 507d includes a substrate holding base 414, a support member 412, lift pins 419 and a lift-pin lift mechanism 421. The cooling unit 507d further includes a cooling device 517 which cools the substrate W held by the substrate holding base 414. The cooling device 517 is, for example, of a water cooled type. The cooling device 517 is embedded in the substrate holding base 414. The substrate W held by the substrate holding base 414 is cooled in contact with the substrate holding base 414 (cooling process, cooling step). Thus, the temperature of the substrate W is reduced to a predetermined level not higher than the room temperature, and kept at the predetermined level.

FIG. 21 is a diagram for explaining exemplary substrate treatments to be performed by the substrate treatment apparatus 501 according to the fifth embodiment of the present invention. The silylation process, the etching process, the rinsing process and the cooling process shown in FIG. 21 are performed in the silylation unit 407a, the etching unit 407b, the cleaning unit 407c and the cooling unit 507d, respectively. Exemplary selective etching processes will hereinafter be described, which are each performed on a substrate W having an $SiO_2$ film and an SiN film respectively formed as an exemplary oxide film and an exemplary nitride film on a front surface thereof for selectively removing the SiN film by supplying the hydrofluoric acid vapor as an exemplary etching agent to the front surface of the substrate W.

In Exemplary Process 5-1, the controller 4 causes the indexer robot IR and the center robot CR to transport the substrate W from one of the carriers C to the silylation unit 407a. Thereafter, the controller 4 performs the silylation process in the silylation unit 407a. Then, the controller 4 causes the center robot CR to transport the substrate W from the silylation unit 407a to the cooling unit 507d. Thereafter, the controller 4 performs the cooling process in the cooling unit 507d. Thus, the temperature of the substrate W is reduced to the predetermined temperature not higher than the room temperature. Then, the controller 4 causes the center robot CR to transport the substrate W from the cooling unit 507d to the etching unit 407b. Thereafter, the controller 4 performs the etching process in the etching unit 407b. Then, the controller 4 causes the indexer robot IR and the center robot CR to transport the substrate W into the carrier C.

In Exemplary Process 5-2, the controller 4 causes the indexer robot IR and the center robot CR to transport the substrate W from one of the carriers C to the silylation unit 407a, then to the cooling unit 507d and to the etching unit 407b. In the silylation unit 407a, the cooling unit 507d and the etching unit 407b, the controller 4 successively performs the silylation process, the cooling process and the etching process. Then, the controller 4 causes the center robot CR to transport the substrate W from the etching unit 407b to the cleaning unit 407c. Thereafter, the controller 4 performs the rinsing process and the drying process in the cleaning unit 407c. Then, the controller 4 causes the indexer robot IR and the center robot CR to transport the substrate W into the carrier C.

In Exemplary Process 5-3, the controller 4 causes the indexer robot IR and the center robot CR to transport the substrate W from one of the carriers C to the silylation unit 407a, then to the cooling unit 507d and to the etching unit 407b. In the silylation unit 407a, the cooling unit 507d and the etching unit 407b, the controller 4 successively performs the silylation process, the cooling process and the etching process. After the etching process, the controller 4 successively performs the silylation process, the cooling process and the etching process again. That is, the controller 4 performs a repeating step to perform a sequence cycle including the silylation process, the cooling process and the etching process a plurality of times in Exemplary Process 5-3. After the repeating step, the controller 4 causes the center robot CR to transport the substrate W from the etching unit 407b to the cleaning unit 407c. Thereafter, the controller 4 performs the rinsing process and the drying process in the cleaning unit 407c. Then, the controller 4 causes the indexer robot IR and the center robot CR to transport the substrate W into the carrier C.

In Exemplary Process 5-4, the controller 4 causes the indexer robot IR and the center robot CR to transport the substrate W from one of the carriers C to the silylation unit 407a, then to the cooling unit 507d, to the etching unit 407b and to the cleaning unit 407c. In the silylation unit 407a, the cooling unit 507d, the etching unit 407b and the cleaning unit 407c, the controller 4 successively performs the silylation process, the cooling process, the etching process, the rinsing process and the drying process. After the drying process, the controller 4 successively performs the silylation process, the cooling process, the etching process, the rinsing process and the drying process again. That is, the controller 4 performs a repeating step to perform a sequence cycle including the silylation process, the cooling process, the etching process, the rinsing process and the drying process a plurality of times in Exemplary Process 5-4. After the repeating step, the controller 4 causes the indexer robot IR and the center robot CR to transport the substrate W into the carrier C.

Sixth Embodiment

Next, a sixth embodiment of the present invention will be described. A major difference between the sixth embodiment and the fifth embodiment is that the treatment units further include a UV irradiation unit which irradiates a substrate W with UV (ultraviolet radiation). In FIGS. 22 to 25, components equivalent to those shown in FIGS. 1 to 21 are designated by the same reference characters as in FIGS. 1 to 21, and duplicate description will be omitted.

Figure 22:
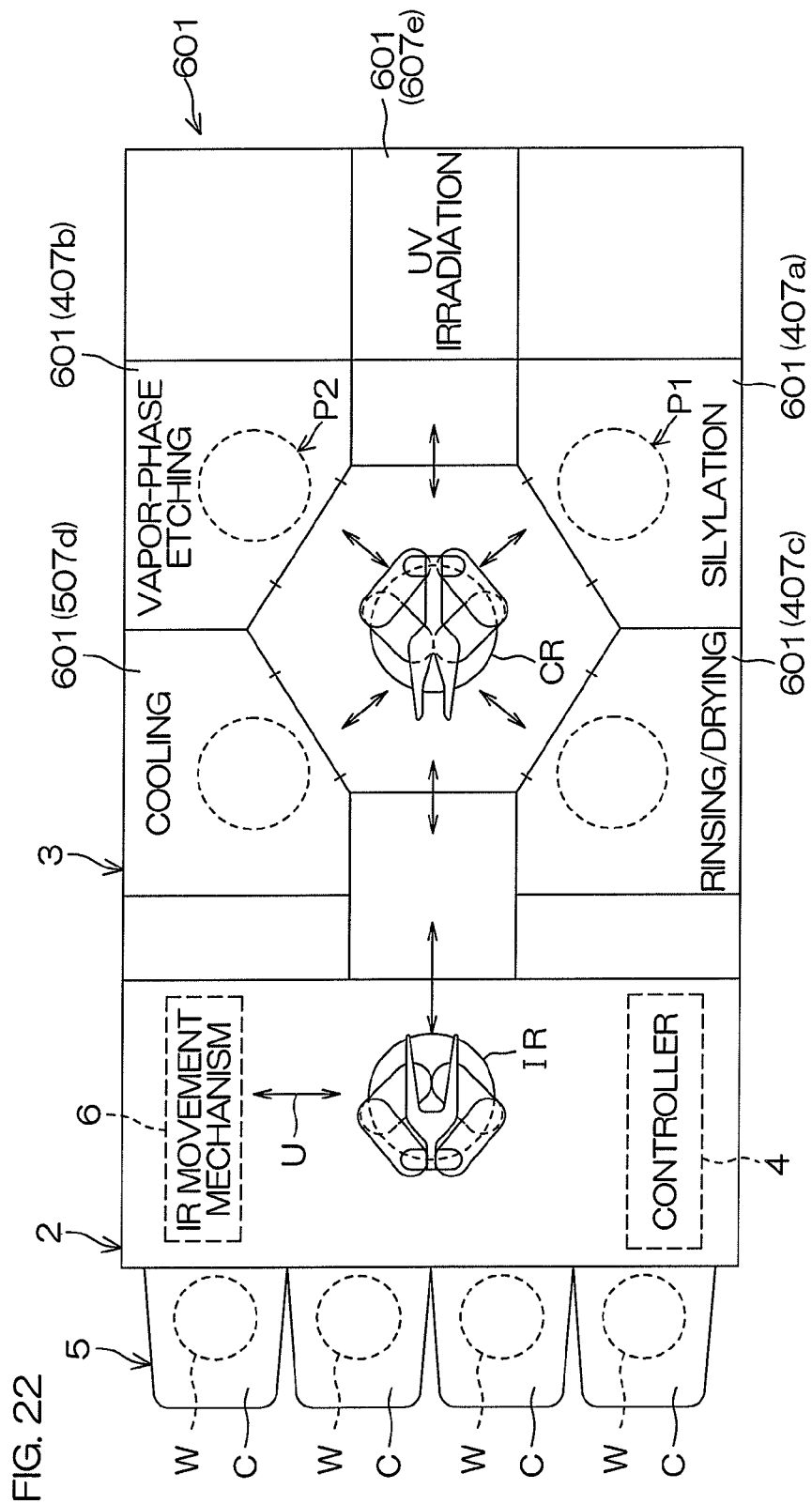
FIG. 22 is a schematic plan view showing a layout in a substrate treatment apparatus according to a sixth embodiment of the present invention.

FIG. 22 is a schematic plan view showing a layout in a substrate treatment apparatus 601 according to the sixth embodiment of the present invention.

The substrate treatment apparatus 601 includes a plurality of treatment units 607 each adapted to treat a substrate W. These treatment units 607 are disposed around a center robot CR as seen in plan. The center robot CR transports a substrate W between an indexer robot IR and the treatment units 607 and between the treatment units 607. The treatment units 607 include a silylation unit 407a, an etching unit 407b, a cleaning unit 407c and a cooling unit 507d. The treatment units 607 further include a UV irradiation unit 607e which irradiates a substrate W with ultraviolet radiation.

Figure 23:
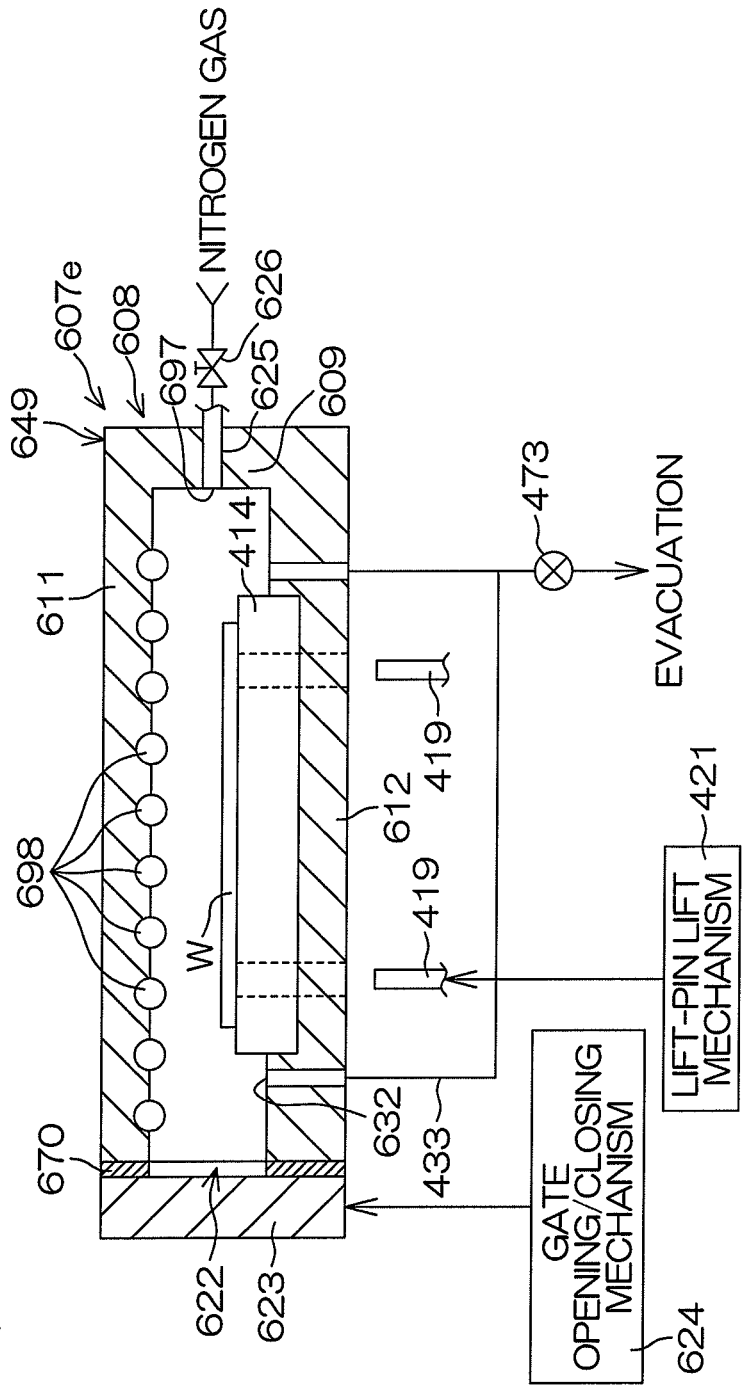
FIG. 23 is a schematic diagram schematically showing the construction of a UV irradiation unit according to the sixth embodiment of the present invention.
Figure 24:
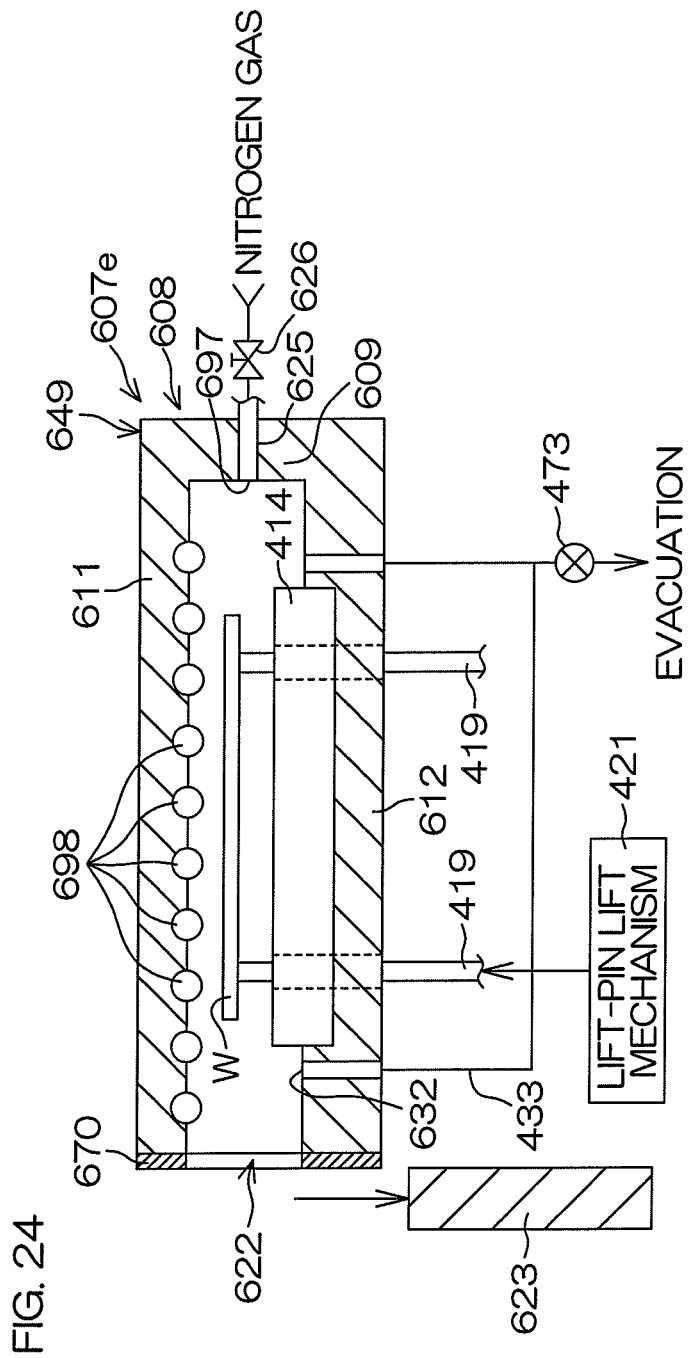
FIG. 24 is a schematic diagram schematically showing the construction of the UV irradiation unit according to the sixth embodiment of the present invention.

FIGS. 23 and 24 are schematic diagrams schematically showing the construction of the UV irradiation unit 607e according to the sixth embodiment of the present invention.

The UV irradiation unit 607e includes a substrate holding base 414, and a chamber 608 which accommodates the substrate holding base 414. The chamber 608 includes a partition wall 649 provided with a gate 622, a gate shutter 623 which opens and closes the gate 622, a seal member 670 (e.g., an O-ring) which seals a gap between the partition wall 649 and the gate shutter 623, and a gate opening/closing mechanism 624 which opens and closes the gate 622. The seal member 670 is attached to the partition wall 649 to be disposed around the gate 622. The seal member 670 may be attached to the gate shutter 623 rather than to the partition wall 649. The gate shutter 623 is connected to the gate opening/closing mechanism 624. The gate opening/closing mechanism 624 moves the gate shutter 623 between a closed position at which the gate 622 is closed by the gate shutter 623 and an open position at which the gate 622 is open. With the gate shutter 623 located at the closed position, the gap between the gate shutter 623 and the partition wall 649 is sealed with the seal member 670. Thus, the inside space of the chamber 608 is sealed.

The UV irradiation unit 607e further includes a plurality of lift pins 419 and a lift-pin lift mechanism 421. The partition wall 649 has a plurality of through-holes extending vertically through a bottom wall 612 thereof, and the substrate holding base 414 also has a plurality of through-holes extending vertically therethrough. When the lift-pin lift mechanism 421 moves up the lift pins 419 from a retracted position (a position shown in FIG. 23) to a projecting position (a position shown in FIG. 24), the lift pins 419 are respectively inserted through the through-holes of the bottom wall 612 and then through the through-holes of the substrate holding base 414, whereby upper ends of the respective lift pins 419 project above an upper surface of the substrate holding base 414. When the lift-pin lift mechanism 421 moves down the lift pins 419 from the projecting position to the retracted position, the upper ends of the lift pins 419 are moved down to a lower side of the upper surface of the substrate holding base 414. The substrate W is transferred between the substrate holding base 414 and the lift pins 419 by moving up and down the lift pins 419.

The UV irradiation unit 607e further includes a lateral inlet pipe 625 through which nitrogen gas is introduced into the chamber 608. The lateral inlet pipe 625 is attached to a side wall 609 of the partition wall 649. A nitrogen gas valve 626 is provided in the lateral inlet pipe 625. With the nitrogen gas valve 626 being open, the nitrogen gas is spouted into the chamber 608 from an outlet port 697 provided in the side wall 609.

An annular gas outlet 632 surrounding the substrate holding base 414 as seen in plan is provided in an upper surface of the bottom wall 612. The gas outlet 632 communicates with the inside of the chamber 608. A gas outlet pipe 433 is connected to the gas outlet 632 at one end thereof. A pressure regulation valve 473 is provided in the gas outlet pipe 433. When the nitrogen gas is spouted from the outlet port 697 with the gate 622 being closed, the internal pressure of the chamber 608 is increased. When the internal pressure reaches a predetermined level, the pressure regulation valve 473 is opened to evacuate the chamber 608 through the gas outlet 632. Thus, the internal pressure of the chamber 608 is reduced. When the internal pressure of the chamber 608 becomes less than the predetermined level, the pressure regulation valve 473 is closed.

The UV irradiation unit 607e further includes UV irradiation lamps 698 (UV irradiation unit). The UV irradiation lamp 698 are attached to a top wall 611 of the partition wall 649. The UV irradiation lamps 698 are positioned so as to be opposed to the substrate W held by the substrate holding base 414. The UV irradiation lamps 698 are each adapted to emit ultraviolet radiation toward the upper surface of the substrate W held by the substrate holding base 414. Thus, the upper surface of the substrate W is evenly irradiated with the ultraviolet radiation. The UV irradiation lamps 698 each emit the ultraviolet radiation, for example, at a wavelength of 185 to 254 nm or at a wavelength of 20 to 200 nm.

Next, exemplary substrate treatments to be performed in the UV irradiation unit 607e will be described.

First, a UV process to be performed by emitting the ultraviolet radiation at 185 to 254 nm from the UV irradiation lamps 698 will be described.

When a substrate W is transported into the UV irradiation unit 607e, the gate shutter 623 is preliminarily located at the open position, and the lift pins 419 are located at the projecting position. In this state, the controller 4 causes the center robot CR to place the substrate W on the lift pins 419. The controller 4 retracts the center robot CR, and then causes the lift-pin lift mechanism 421 to move down the lift pins 419 to the retracted position. Thus, the substrate W supported by the lift pins 419 is placed on the substrate holding base 414, and held by the substrate holding base 414. After the lift pins 419 are moved to the retracted position, the controller 4 causes the gate opening/closing mechanism 624 to move the gate shutter 623 to the closed position. Thus, the inside of the chamber 608 is sealed. Therefore, the substrate W is retained in the sealed space.

Then, the substrate W is irradiated with the ultraviolet radiation. More specifically, the controller 4 causes the UV irradiation lamps 698 to emit the ultraviolet radiation with the gate shutter 623 located at the closed position. Thus, the upper surface of the substrate W held on the substrate holding base 414 is evenly irradiated with the ultraviolet radiation. The substrate W is heated by the irradiation with the ultraviolet radiation. Further, organic substances and other foreign matter adhering to the substrate W are removed by the irradiation with the ultraviolet radiation. In this manner, the UV process (UV irradiation step) is performed. After the irradiation with the ultraviolet radiation is continued for a predetermined period, the controller 4 causes the UV irradiation lamps 698 to stop emitting the ultraviolet radiation.

In turn, the atmosphere in the chamber 608 is replaced with a nitrogen gas atmosphere. More specifically, the controller 4 opens the nitrogen gas valve 626 to spout the nitrogen gas from the outlet port 697 with the gate shutter 623 located at the closed position. Thus, the nitrogen gas is supplied into the chamber 608. Therefore, the internal pressure of the chamber 608 is increased, so that the pressure regulation valve 473 is opened. Therefore, the chamber 608 is evacuated through the gas outlet 632. Thus, the atmosphere in the chamber 608 is replaced with the nitrogen gas.

Subsequently, the substrate W is unloaded from the UV irradiation unit 607e. More specifically, the controller 4 causes the gate opening/closing mechanism 624 to move the gate shutter 623 to the open position. Thereafter, the controller 4 causes the lift-pin lift mechanism 421 to move up the lift pins 419 to the projecting position. Thus, the substrate W held on the substrate holding base 414 is supported by the lift pins 419. After the lift pins 419 are moved to the projecting position, the controller 4 causes the center robot CR to unload the substrate W supported by the lift pins 419. Thus, the substrate W is transported out of the UV irradiation unit 607e.

Next, a UV process to be performed by emitting the ultraviolet radiation at a wavelength of 20 to 200 nm from the UV irradiation lamps 698 will be described.

When a substrate W is transported into the UV irradiation unit 607e, the gate shutter 623 is preliminarily located at the open position, and the lift pins 419 are located at the projecting position. In this state, the controller 4 causes the center robot CR to place the substrate W on the lift pins 419. The controller 4 retracts the center robot CR, and then causes the lift-pin lift mechanism 421 to move down the lift pins 419 to the retracted position. Thus, the substrate W supported by the lift pins 419 is placed on the substrate holding base 414, and held by the substrate holding base 414. After the lift pins 419 are moved to the retracted position, the controller 4 causes the gate opening/closing mechanism 624 to move the gate shutter 623 to the closed position. Thus, the inside of the chamber 608 is sealed. Therefore, the substrate W is retained in the sealed space.

In turn, the nitrogen gas is introduced into the atmosphere in the chamber 608. More specifically, the controller 4 opens the nitrogen gas valve 626 to spout the nitrogen gas from the outlet port 697 with the gate shutter 623 located at the closed position. Thus, the nitrogen gas is supplied into the chamber 608. Therefore, the internal pressure of the chamber 608 is increased, so that the pressure regulation valve 473 is opened. Therefore, the chamber 608 is evacuated through the gas outlet 632. Thus, the nitrogen gas is further supplied into the chamber 608. At this time, the supply of the nitrogen gas is controlled so that the internal oxygen concentration of the chamber 608 is 1 to 10%. Thereafter, the controller 4 closes the nitrogen gas valve 626. Thus, the pressure regulation valve 473 is closed to stop the evacuation of the chamber 608. Therefore, the chamber 608 is constantly filled with air and the nitrogen gas.

Then, the substrate W is irradiated with the ultraviolet radiation. More specifically, the controller 4 causes the UV irradiation lamps 698 to emit the ultraviolet radiation with the gate shutter 623 located at the closed position. Thus, the upper surface of the substrate W held on the substrate holding base 414 is evenly irradiated with the ultraviolet radiation. Since the atmosphere in the chamber 608 is replaced with the nitrogen gas atmosphere, the irradiation of the upper surface of the substrate W with the ultraviolet radiation is achieved in the nitrogen gas atmosphere. The substrate W is heated by the irradiation with the ultraviolet radiation. Further, organic substances and other foreign matter adhering to the substrate W are removed by the irradiation with the ultraviolet radiation. In this manner, the UV process (UV irradiation step) is performed. After the irradiation with the ultraviolet radiation is continued for a predetermined period, the controller 4 causes the UV irradiation lamps 698 to stop emitting the ultraviolet radiation.

In turn, the atmosphere in the chamber 608 is replaced with a nitrogen gas atmosphere. More specifically, the controller 4 opens the nitrogen gas valve 626 to spout the nitrogen gas from the outlet port 697 with the gate shutter 623 located at the closed position. Thus, the nitrogen gas is supplied into the chamber 608. Therefore, the internal pressure of the chamber 608 is increased, so that the pressure regulation valve 473 is opened. Therefore, the chamber 608 is evacuated through the gas outlet 632. Thus, the atmosphere in the chamber 608 is replaced with the nitrogen gas.

Subsequently, the substrate W is unloaded from the UV irradiation unit 607e. More specifically, the controller 4 causes the gate opening/closing mechanism 624 to move the gate shutter 623 to the open position. Thereafter, the controller 4 causes the lift-pin lift mechanism 421 to move up the lift pins 419 to the projecting position. Thus, the substrate W held on the substrate holding base 414 is supported by the lift pins 419. After the lift pins 419 are moved to the projecting position, the controller 4 causes the center robot CR to unload the substrate W supported by the lift pins 419. Thus, the substrate W is transported out of the UV irradiation unit 607e.

FIG. 25 is a diagram for explaining exemplary substrate treatments to be performed by the substrate treatment apparatus 601 according to the sixth embodiment of the present invention. The silylation process, the etching process, the rinsing process and the UV process shown in FIG. 25 are performed in the silylation unit 407a, the etching unit 407b, the cleaning unit 407c and the UV irradiation unit 607e, respectively. Exemplary selective etching processes will hereinafter be described, which are each performed on a substrate W having an SiO$_2$ film and an SiN film respectively formed as an exemplary oxide film and an exemplary nitride film on a front surface thereof for selectively removing the SiN film by supplying the hydrofluoric acid vapor as an exemplary etching agent to the front surface of the substrate W.

In Exemplary Process 6-1, the controller 4 causes the indexer robot IR and the center robot CR to transport the substrate W from one of the carriers C to the UV irradiation unit 607e. Thereafter, the controller 4 performs the UV process (pre-silylation UV irradiation step) in the UV irradiation unit 607e. Thus, organic substances are removed from the substrate W. Then, the controller 4 causes the center robot CR to transport the substrate W from the UV irradiation unit 607e to the silylation unit 407a. Thereafter, the controller 4 performs the silylation process in the silylation unit 407a. Then, the controller 4 causes the center robot CR to transport the substrate W from the silylation unit 407a to the etching unit 407b. Thereafter, the controller 4 performs the etching process in the etching unit 407b. Then, the controller 4 causes the indexer robot IR and the center robot CR to transport the substrate W into the carrier C.

In Exemplary Process 6-2, the controller 4 causes the indexer robot IR and the center robot CR to transport the substrate W from one of the carriers C to the UV irradiation unit 607e, then to the silylation unit 407a and to the etching units 407b. In the UV irradiation unit 607e, the silylation unit 407a and the etching units 407b, the controller 4 successively performs the UV process (pre-silylation UV irradiation step), the silylation process and the etching process. Then, the controller 4 causes the center robot CR to transport the substrate W from the etching unit 407b to the UV irradiation unit 607e. Thereafter, the controller 4 performs the UV process (post-silylation UV irradiation step) in the UV irradiation unit 607e. Thus, the silylation agent (e.g., HMDS) is removed from the substrate W. Then, the controller 4 causes the indexer robot IR and the center robot CR to transport the substrate W into the carrier C.

In Exemplary Process 6-1 described above, the controller 4 may perform the rinsing process and the drying process in the cleaning unit 407c to rinse away liquid and foreign matter adhering to the substrate W after the etching process (see Exemplary Process 6-3). In Exemplary Processes 6-1 and 6-3, the controller 4 may perform the cooling process in the cooling unit 507d after the silylation process before the etching process. Similarly, in Exemplary Process 6-2, the controller 4 may perform the rinsing process and the drying process in the cleaning unit 407c to rinse away liquid and foreign matter adhering to the substrate W after the second UV process (see Exemplary Process 6-4). In Exemplary Processes 6-2 and 6-4, the controller 4 may perform the cooling process in the cooling unit 507d after the silylation process before the etching process.

In Exemplary Process 6-5, the controller 4 causes the indexer robot IR and the center robot CR to transport the substrate W from one of the carriers C to the UV irradiation unit 607e, then to the silylation unit 407a and to the etching unit 407b. In the UV irradiation unit 607e, the silylation unit 407a and the etching unit 407b, the controller 4 successively performs the UV process (pre-silylation UV irradiation step), the silylation process and the etching process. After the etching process, the controller 4 successively performs the silylation process and the etching process again. That is, the controller 4 performs a repeating step to perform a sequence cycle including the silylation process and the etching process a plurality of times after the UV process in Exemplary Process 6-5. After the repeating step, the controller 4 causes the center robot CR to transport the substrate W from the etching unit 407b to the cleaning unit 407c. Thereafter, the controller 4 performs the rinsing process and the drying process in the cleaning unit 407c. Then, the controller 4 causes the indexer robot IR and the center robot CR to transport the substrate W into the carrier C.

In Exemplary Process 6-6, the controller 4 causes the indexer robot IR and the center robot CR to transport the substrate W from one of the carriers C to the UV irradiation unit 607e, then to the silylation unit 407a and to the etching unit 407b. In UV irradiation unit 607e, the silylation unit 407a and the etching unit 407b, the controller 4 successively performs the UV process (pre-silylation UV irradiation step), the silylation process and the etching process. After the etching process, the controller 4 successively performs the silylation process and the etching process again. That is, the controller 4 performs a repeating step to perform a sequence cycle including the silylation process and the etching process a plurality of times after the UV process in Exemplary Process 6-6. After the repeating step, the controller 4 causes the center robot CR to transport the substrate W from the etching unit 407b to UV irradiation unit 607e. Thereafter, the controller 4 performs the UV process (post-silylation UV irradiation step) in the UV irradiation unit 607e. Then, the controller 4 causes the center robot CR to transport the substrate W from the UV irradiation unit 607e to the cleaning unit 407c. Thereafter, the controller 4 performs the rinsing process and the drying process in the cleaning unit 407c. Then, the controller 4 causes the indexer robot IR and the center robot CR to transport the substrate W into the carrier C.

In Exemplary Process 6-5 described above, the controller 4 may repeatedly perform the rinsing process and the drying process in combination with the silylation process and the etching process. That is, the rinsing process and the drying process to be performed after the repeating step in Exemplary process 6-5 may be included in the sequence cycle, so that the silylation process, the etching process, the rinsing process and the drying process may be repeatedly successively performed (see Exemplary Process 6-7). Similarly, the UV process, the rinsing process and the drying process to be performed after the repeating step in Exemplary Process 6-6 may be included in the sequence cycle, so that the silylation process, the etching process, the UV process, the rinsing process and the drying process may be repeatedly successively performed (see Exemplary Process 6-8). In Exemplary processes 6-5 to 6-8, the cooling process may be performed after the silylation process before the etching process. That is, the sequence cycles in Exemplary Processes 6-5 to 6-8 may each include the cooling process. Where the UV process (UV irradiation step) is included in the sequence cycle as in Exemplary Process 6-8, the UV process is performed after the silylation process (silylation step) in the same cycle. Therefore, this UV process is defined as the post-silylation UV irradiation step. Further, the UV process is performed before the silylation process in the subsequent cycle. Therefore, this UV process is defined as the pre-silylation UV irradiation step.

In the sixth embodiment, as described above, the silylation agent and then the etching agent are supplied to the substrate W irradiated with the ultraviolet radiation. The irradiation of the substrate W with the ultraviolet radiation makes it possible to remove the organic substances and other foreign matter adhering to the substrate W. This improves the reactivity of the silylation agent and the etching agent with the substrate W, thereby improving the selectivity. In the sixth embodiment, the silylated substrate W is irradiated with the ultraviolet radiation, whereby the silylation agent such as HMDS adhering to the substrate W can be removed. This improves the cleanliness of the substrate W.

In the sixth embodiment, the sequence cycle including the silylation step, the etching step and the UV irradiation step is performed a plurality of times. That is, the substrate W to which the silylation agent and then the etching agent have been supplied in the same cycle is irradiated with the ultraviolet radiation and, in the second and subsequent cycles, the silylation agent and then the etching agent are supplied to the substrate W irradiated with the ultraviolet radiation. As described above, the silylation agent adhering to the substrate W can be removed by irradiating the silylated substrate W with the ultraviolet radiation. This improves the cleanliness of the substrate W. In the second and subsequent cycles, the silylation agent and then the etching agent are supplied to the substrate W from which the organic substances and other foreign matter have been removed by the irradiation with the ultraviolet radiation. This improves the reactivity of the silylation agent and the etching agent with the substrate W in the second and subsequent cycles, thereby improving the selectivity.

While the embodiments of the present invention have thus been described, it should be understood that the present invention be not limited to the first to sixth embodiments, but may be embodied in other ways.

The first to sixth embodiments described above are directed to the substrate treatment apparatuses of the single substrate treatment type, but the substrate treatment apparatuses may be batch type substrate treatment apparatuses which are adapted to treat a plurality of substrates W at a time. More specifically, the substrate treatment apparatuses according to the first to sixth embodiments may be of a batch type which includes a treatment vessel which stores a treatment liquid in which the plurality of substrates W are immersed, a silylation agent supply mechanism which supplies a silylation agent to the treatment vessel, and an etching agent supply mechanism which supplies an etching agent to the treatment vessel.

In the first and second embodiments described above, the etching liquid is supplied as the etching agent to the substrate, but a vapor containing an etching component may be supplied as the etching agent to the substrate. For example, a vapor containing an etching component (e.g., hydrofluoric acid vapor) may be supplied to the substrate from the etching agent nozzle 39.

In the second embodiment described above, all the treatment units 207 are silylation/etching units 207a, but the treatment units 207 may include a unit other than the silylation/etching units 207a.

In the first and second embodiments described above, the silylation step and the etching step are each performed once, but may be performed again on the substrate W once subjected to the silylation step and the etching step. The supply of the silylation agent suppresses the etching of the oxide film. However, if the etching step is performed for a longer period of time, the oxide etching suppression effect is reduced with time, thereby reducing the selectivity. Where the etching step is performed for a longer period of time, therefore, the silylation step is performed between the former etching step and the latter etching step. Thus, the selectivity can be maintained at a higher level in the etching steps.

In the fourth to sixth embodiments described above, the hydrofluoric acid vapor is employed for the etching of the substrate, but an etching agent other than the hydrofluoric acid may be employed for the etching of the substrate. Further, the etching agent to be supplied to the substrate may be in a vapor form or in a liquid form.

In the fourth embodiment described above, the silylation unit, the etching unit and the cleaning unit are independent of each other, but two or more of the silylation unit, the etching unit and the cleaning unit may be unified together. More specifically, the silylation unit and the etching unit may be unified together as in the second embodiment. Alternatively, the silylation unit, the etching unit and the cleaning unit may be unified together.

In the fifth embodiment described above, similarly, the silylation unit, the etching unit, the cleaning unit and the cooling unit are independent of each other, but two or more of these units may be unified together. In the sixth embodiment, similarly, two or more of the silylation unit, the etching unit, the cleaning unit, the cooling unit and the UV irradiation unit may be unified together. More specifically, the silylation unit and the etching unit may be unified together as in the second embodiment. Further, the cooling device may be embedded in the substrate holding base provided in the UV irradiation unit to unify the cooling unit and the UV irradiation unit.

While preferred embodiments of the present invention have been described above, it is to be understood that variations and modifications will be apparent to those skilled in the art without departing the scope and spirit of the present invention. The scope of the present invention, therefore, is determined solely by the following claims.

The present application corresponds to Japanese Patent Application Nos. 2011-010154 and 2011-063722 filed in the Japan Patent Office on Jan. 20, 2011 and Mar. 23, 2011, respectively, and the entire disclosures of the applications are incorporated herein by reference.

What is claimed is:

1. A substrate treatment method comprising:
 a silylation step of supplying a silylation agent to a substrate formed with a silicon oxide film and a silicon nitride film, to increase selective etching of the silicon nitride film with respect to the silicon oxide film; and
 a selective etching step of supplying an etching agent for selective etching of the silicon nitride film to the substrate after the silylation step, thereby selectively etching the silicon nitride film with suppressed etching of the silicon oxide film.

2. The substrate treatment method according to claim 1, further comprising a heating step of heating the substrate, the heating step being performed simultaneously with the silylation step.

3. The substrate treatment method according to claim 1, further comprising a repeating step of repeating a sequence cycle including the silylation step and the etching step a plurality of times.

4. The substrate treatment method according to claim 3, wherein the cycle further includes a rinsing step of supplying a rinse liquid to the substrate after the etching step.

5. The substrate treatment method according to claim 3, wherein the cycle further includes a UV irradiation step of irradiating the substrate with ultraviolet radiation after the etching step.

6. The substrate treatment method according to claim 1, further comprising a pre-silylation UV irradiation step of irradiating the substrate with ultraviolet radiation before the silylation step.

7. The substrate treatment method according to claim 1, further comprising a post-silylation UV irradiation step of irradiating the substrate with ultraviolet radiation after the silylation step.

8. The substrate treatment method according to claim 1, further comprising:
 a pre-silylation UV irradiation step of irradiating the substrate with ultraviolet radiation before the silylation step; and
 a post-silylation UV irradiation step of irradiating the substrate with the ultraviolet radiation after the silylation step.

9. The substrate treatment method according to claim 1, wherein the etching agent is a liquid mixture comprising hydrofluoric acid and ethylene glycol, a phosphoric acid aqueous solution, or a hydrofluoric acid.

10. The substrate treatment method according to claim 1, wherein the silylation agent is nonaqueous,
 wherein the etching agent is aqueous.

11. The substrate treatment method according to claim 1, wherein the etching agent is a vapor comprising an etching component.

12. The substrate treatment method according to claim 1, further comprising:
 a rinsing step of supplying a rinse liquid to the substrate after the etching step, and
 a drying step of removing the rinse liquid adhering to the substrate to dry the substrate after the rinsing step.

13. The substrate treatment method according to claim 1, wherein the silylation agent is a silylation agent vapor or a silylation agent liquid.

* * * * *